(12) United States Patent
Fish

(10) Patent No.: US 6,411,227 B1
(45) Date of Patent: Jun. 25, 2002

(54) DUAL MODE DATA COMPRESSION FOR OPERATING CODE

(75) Inventor: Wilson Massey Fish, Yukon, OK (US)

(73) Assignee: Seagate Technology LLC, Scotts Valley, CA (US)

(*) Notice: Subject to any disclaimer, the term of this patent is extended or adjusted under 35 U.S.C. 154(b) by 0 days.

(21) Appl. No.: 09/928,867

(22) Filed: Aug. 13, 2001

Related U.S. Application Data

(60) Provisional application No. 60/225,256, filed on Aug. 15, 2000.

(51) Int. Cl.[7] .............................. H03M 7/38; H03M 7/40
(52) U.S. Cl. ............................................. 341/65; 341/51
(58) Field of Search ............................... 341/65, 51, 63, 341/67, 55, 87, 107; 382/240, 244; 707/1; 709/247; 711/170

(56) References Cited

U.S. PATENT DOCUMENTS

| | | | |
|---|---|---|---|
| 4,464,650 A | 8/1984 | Eastman et al. | |
| 4,558,302 A | 12/1985 | Welch | |
| 4,701,745 A | 10/1987 | Waterworth | |
| 4,906,991 A | 3/1990 | Fiala et al. | |
| 4,955,066 A | 9/1990 | Notenboom | |
| 4,961,139 A | 10/1990 | Hong et al. | |
| 5,001,478 A | 3/1991 | Nagy | |
| 5,016,009 A | 5/1991 | Whiting et al. | |
| 5,051,745 A | 9/1991 | Katz | |
| 5,140,321 A | 8/1992 | Jung | |
| 5,155,484 A | 10/1992 | Chambers, IV | |
| 5,281,967 A | 1/1994 | Jung | |
| 5,392,036 A | 2/1995 | Klein | |
| 5,406,279 A | 4/1995 | Anderson et al. | |
| 5,455,577 A | 10/1995 | Slivka et al. | |
| 5,532,694 A | 7/1996 | Mayers et al. | |
| 5,761,688 A | * 6/1998 | Morishita | 707/532 |
| 5,889,961 A | 3/1999 | Dobbek | |
| 5,933,104 A | 8/1999 | Kimura | |
| 5,970,177 A | 10/1999 | Chinnock | |
| 6,037,883 A | 3/2000 | Forbes | |
| 6,075,470 A | 6/2000 | Little et al. | |
| 6,145,069 A | 11/2000 | Dye | |

OTHER PUBLICATIONS

Excerpt from www.delphion.com website, Intellectual Property Network,, "Compression and Dynamic Decompression of Executable Code," IBM Technical Disclosure Bulletin, Jul. 1990, pp. 297–298.

* cited by examiner

*Primary Examiner*—Patrick Wamsley
(74) *Attorney, Agent, or Firm*—Steven J. Spellman; Merchant & Gould

(57) ABSTRACT

A sliding window type compression scheme is combined with a statistical type compression scheme to provide a dual-mode compression scheme that is optimized for use in compressing operating code in a data storage device. In a sliding window portion of the compression scheme, root and copy items are created, wherein the copy items include a length value and an offset value. The length values and most significant portions of the offset values are then compressed separately in the statistical portion of the compression scheme to form a compressed output which, when combined with the root items form a dually-compressed compressed output. A complimentary decompression scheme is then used to decompress the dually-compressed output.

29 Claims, 12 Drawing Sheets

DUAL MODE DATA COMPRESSION FOR OPERATING CODE

RELATED APPLICATIONS

This application claims priority of U.S. provisional application Ser. No. 60/225,256, filed Aug. 15, 2000.

FIELD OF THE INVENTION

This application relates generally to data compression and decompression and more particularly to data compression and decompression of firmware used in a disc drive.

BACKGROUND OF THE INVENTION

There has been a continuous move in the disc drive industry generally to reduce the size and costs of disc drive systems, including both high- and low-end systems. One area where significant cost and size reductions may be made is the area of non-volatile memory components, which are often the most expensive components of disc drive systems. Non-volatile memory components, such as ROM or flash RAM, etc., are typically incorporated in disc drives for the storage of the operating code of the disc drive. Upon the start of the drive, portions of the disc drive operating code that must be accessed quickly, are typically transferred from the ROM or flash RAM to volatile memory (such as standard RAM) in the disc drive. These portions of the operating code may then be accessed quickly for execution by the disc drive microprocessor. The remaining portions of the disc drive operating code are left in the non-volatile memory from which they are accessed and executed.

Numerous approaches have been proposed and implemented which are directed to reducing the use of non-volatile memory in the disc drive, thereby reducing the cost of the disc drive. One such approach involves compressing the operating code of the disc drive and storing the compressed operating code in the non-volatile memory of the disc drive. Upon start up of the drive, a small bootstrap program is used to decompress the compressed operating code and to store the decompressed operating code in volatile memory of the disc drive. The disc drive operating code is then accessed from the volatile memory and executed by the disc drive microprocessor. By compressing the disc drive's firmware a significant reduction in the size of the non-volatile memory used to store the firmware may be achieved, with a corresponding reduction in the cost of the non-volatile memory and the disc drive as a whole. One such approach utilizes a single-mode, Huffman-type compression technique in a 2-processor decompression method where one processor performs the decompression of the operating code and loads it into RAM for use by the second processor.

In general, data compression converts data defined in a given format to another format so that the resulting compressed format contains fewer data bits (i.e., the ones and zeros that define digital data) than the original format. Hence, the data is compressed into a smaller representation. When the original data is needed, the compressed data is then decompressed using an algorithm that is complementary to the compression algorithm.

There are two principal types of data compression/decompression schemes (herein after referred to simply as compression schemes), lossless compression schemes and lossy compression schemes. Lossy compression refers to schemes in which the decompressed data is not exactly the same as the original data. In lossy type compression scheme, certain elements of the data are intentionally omitted or lost during the processes of compressing and decompressing the data. Lossy compression schemes are typically used in the compression of images or sounds where the loss of limited or redundant data in the decompressed data is typically unnoticeable and, therefore, acceptable. Lossy compression schemes are not, however, suitable for compressing executable files, such as operating code files, where the loss of even a single bit of information may render the file useless. In applications where the loss of data is unacceptable, lossless compression schemes are preferable if not required.

In the field of lossless data compression there are two general types of compression techniques: (1) dictionary based (or sliding-window) compression; and (2) statistical compression. Dictionary-based compression schemes examine the input data stream and look for groups of symbols or characters that appear in a dictionary that is built using data that has already been compressed. If a match is found, a single pointer or index into the dictionary is output into the compressed data stream instead of the group of symbols. In this way, a commonly-occurring group of symbols can be replaced by a smaller index value. The principal difference between the numerous dictionary-based schemes is how the dictionary is built and maintained, and how matches are found.

One well-known dictionary based scheme is the LZ77 algorithm. The basic LZ77 scheme is described in Ziv, J. and Lempel, A., "A Universal Algorithm for Sequential Data Compression," *IEEE Transactions on Information Theory*, Vol. 23, May 1977, pp. 337–343. The LZ77 scheme uses a single pass literal/copy algorithm to compress or encode and decompress or decode a data sequence. Simply put, the LZ77 scheme compresses a data stream by replacing reoccurring patterns of data in an incoming data stream with short codes in a compressed output data stream. Typically, LZ77 schemes search for reoccurring strings of data that are three symbols or bytes in length. Symbols in the uncompressed input data stream are either directly incorporated into the compressed data output stream as uncompressed strings (referred to as "root items" or "literals") or, alternatively, are replaced by pointers to a matching set of root items that has already been incorporated into the compressed data output stream (i.e., as "copy items"). The copy items contain offset and length information that requires fewer or the same number of bytes as the replaced literal data. The offset, or offset value specifies the offset of the string being encoded relative to its previous occurrence. For example, if a specific literal string of five symbols occurred ten bytes before an identical occurrence that is being encoded, the offset is ten. The length specifies the length of the string being replaced by the copy item. In this example, the length field is five and specifies the length of the matching data sequence in symbols or bytes. Compression is realized by representing as much of the uncompressed data sequence as possible as copy items. Root items are typically incorporated into the compressed data sequence only when a match of three or more symbols cannot be found.

Statistical compression schemes, such as the Huffman scheme, build a statistical model of a data stream by reading and evaluating the entire data stream prior to compressing the stream. For example, during an initial evaluation of a data stream, Huffman encoding creates a statistical "tree" (Huffman tree) or ranking based on the number of occurrences of each symbol. This Huffman tree identifies each symbol in the data stream by frequency of occurrence. After the tree has been created, the repeated symbols in the stream are replaced with a variable-length code that corresponds to the value in the Huffman tree of that particular symbol, to create a compressed stream of data. For example, the most frequent symbol may be assigned the smallest code in the tree, thus replacing the most-frequently occurring symbol with the smallest possible code.

In addition to the use of either of the above-described LZ77 and Huffman encoding schemes alone, it has been found that these schemes can be combined to achieve even greater compression of a data stream than can be accomplished using a single compression scheme. A typical example of this type of "dual-mode" compression scheme involves using Huffman encoding to further compress a data stream that has previously been output by an LZ77 scheme to create a Huffman/LZ77 compressed data stream. Because of their high compression, simplicity, and fast compression speed, the use of dual-mode compression schemes has become prevalent in typical data compression applications.

While typical dual-mode compression schemes or algorithms may be more effective in certain applications than single-mode compression schemes, these typical dual-mode compression schemes have several drawbacks that may severely limit their effectiveness for use in typical disc drives. One drawback that may occur when using a typical dual-mode compression schemes in a disc drive relates to decompression speed. Typical dual-mode compression algorithms are designed to be run on processors, such as those found in personal computers and workstations, that have significant stack space for executing programs. Put another way, dual-mode compression algorithms are typically optimized to be executed on processors having significant stack space and that allow for low interrupt and context switch latency. This is particularly true in dual-mode compression schemes that include a Huffman mode employing a recursive algorithm to process or navigate a typical Huffman tree.

In contrast to the processors used in personal computers or workstations, a typical disc drive employs a small processor with a very limited stack space. For example, disc drives often utilize a digital signal processor (DSP) as a primary processor. While DSPs typically have high computational speed, they often have very limited stack support and very high interrupt and context switch latency. For this reason, the processors normally used in disc drives are generally not suited for typical dual-mode compression algorithms that rely on significant stack space and low interrupt and context switch latency. In particular, the processors typically used in disc drives are not suited for dual-mode compression algorithms that include a typical Huffman scheme employing recursive algorithms.

Yet another potential problem with employing typical dual-mode compression schemes in a disc drive relates to the small size of the operating code used in disc drives. Dual-mode compression schemes are generally optimized for compressing large data files such as image, database, and audio files. As such, these compression schemes are typically not effective for compressing small data blocks into smaller data blocks, due to the "overhead," such as dictionaries or Huffman trees, which the dual compression schemes require. For instance, typical Huffman trees are constructed to optimize both the compression of large data files and the speed of the compression step. This is typically achieved by making the Huffman tree quite large. For larger data files such as image files, this level of overhead is more than compensated for by the optimum compression speed and the overall compression achieved. But for small data files, such as the operating code for a disc drive, the overhead due to the size of a typical Huffman tree is unacceptable. In fact, for a small block of data, the size of the compressed data when added to the size of the Huffman tree can be larger than the original data file, thus negating the benefit of compressing the small data file.

It is with respect to these considerations and others that the present invention has been developed.

SUMMARY OF THE INVENTION

A dual-mode compression/decompression scheme has been developed for use in compressing operating code for data storage devices. Compressed data is created via a dual-mode compression scheme in a form that is conducive to rapid decompression, particularly. suited to applications where processing resources are limited, such as data storage devices. In one embodiment, a modified LZ77 type compression/decompression scheme is combined with a unique Huffman type compression/decompression scheme to provide a dual-mode scheme that is optimized for use in compressing and decompressing operating code for disc drives.

Another embodiment relates to a method of compressing a data input file to create a compressed data output file. The method includes sequentially examining the data input file using a sliding window compression scheme to create root items and copy items. The copy items each have a length value and an offset value. The offset values are subdivided into a most significant portion and a least significant portion that are dealt with differently by the method. The method creates an abridged root/copy file that includes the root items and the least significant portions of the offset values of the copy items. The method compresses the most significant portions of the offset values of the copy items to create a compressed offset file. The method also compresses the length values of the copy items to create a compressed length file. As part of the method, the abridged root/copy file, the compressed offset file, and the compressed length file are combined to create the compressed data output file.

In compliment to the above-mentioned method, another embodiment relates to a method for decompressing a compressed data input file that comprises a compressed length file, a compressed offset file, and an abridged root/copy file. In this method, the abridged root/copy file has root items and compressed copy items. Each of the compressed copy items comprises a least significant portion of an offset value of an uncompressed copy item. Each uncompressed copy item comprises a length value and an offset value.

In an initial step of the decompression method, the compressed data input file is receiving and the compressed length file is decompressed to obtain length values. Similarly, the compressed offset file is decompressed to obtain the most significant portions of the offset values. Uncompressed copy items are then formed from the least significant portions of the offset values obtained from the abridged root/copy file, the most significant portions of the offset values, and the length values. The method determines matching data strings identified by the uncompressed copy items and outputs a decompressed data output file comprising the root items and matching data strings.

Another embodiment relates to a data storage device with compressed operating code file stored in non-volatile memory therein, and a decompressor module operable to decompress the compressed operating code file. In this embodiment, the compressed operating code file includes a first compressed file, a second compressed file, and an abridged root/copy file.

These and various other features as well as advantages which symbolize the present invention will be apparent from a reading of the following detailed description and a review of the associated drawings.

DETAILED DESCRIPTION

In general, the present disclosure describes methods and systems for compressing and expanding digital data. More particularly, the present disclosure describes a data compressor module and a data decompressor module which utilize unique dual-mode compression and decompression schemes. More particularly still, the present disclosure describes a data compressor module for compressing operating/firmware code (operating code) for storage in a memory of a data storage device and a data decompressor module operable within the data storage device for decompressing the compressed code from the memory of the data storage device.

Figure 1:
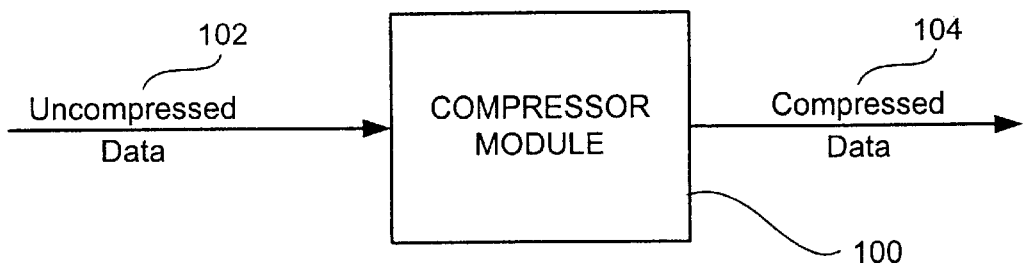
FIG. 1 is a block diagram of a compressor module in accordance with an embodiment of the present invention.

FIG. 1 illustrates a simplified representation of a compressor module 100 in accordance with an embodiment of the present invention. As shown in FIG. 1, the compressor module 100 receives an incoming stream of uncompressed data 102 and outputs a stream of compressed data 104. As explained in greater detail below, the compressor module 100 employs a unique dual-mode compression scheme to compact the uncompressed data stream 102 into a compressed data stream 104.

Figure 2:
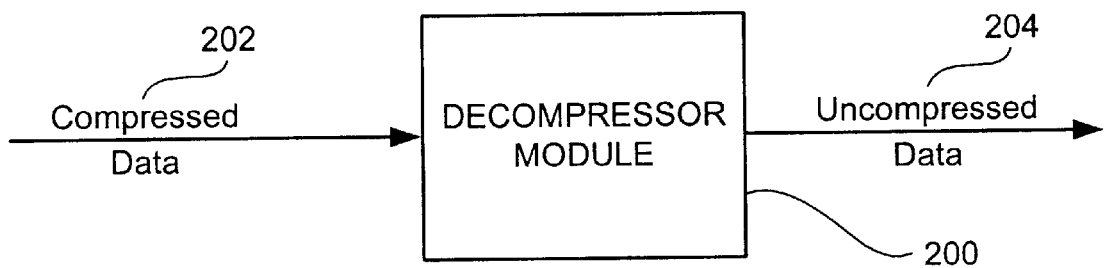
FIG. 2 is a block diagram of a decompressor module in accordance with an embodiment of the present invention.

FIG. 2 illustrates a simplified representation of a decompressor module 200 in accordance with an embodiment of the present invention. As shown in FIG. 2, in one embodiment of the present invention the decompressor module 200 receives a stream of compressed data 202 and utilizes a unique dual-mode decompression scheme that is complimentary to the above-mentioned unique dual-mode compression scheme to expand the compressed data stream 202 into an output stream of uncompressed data 204.

Figure 3:
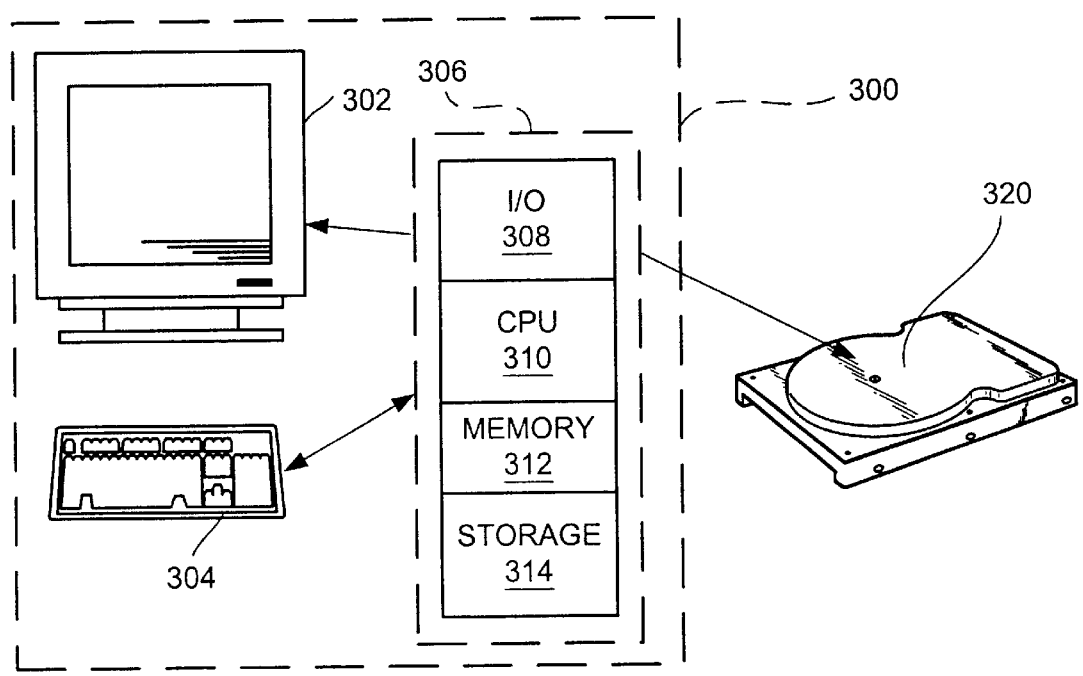
FIG. 3 is an exemplary operating environment for the compressor module shown in FIG. 1 and the decompressor module shown in FIG. 2.

In one embodiment, the compressor module 100 is implemented in a general purpose computer 300 to compress operating code for a data storage device, such as disc drive 320, as shown in FIG. 3. The decompressor module 200 (FIG. 2) is then employed in the disc drive 320, to expand the disc drive operating code at, for example, start up of the disc drive 320.

In this embodiment, and other embodiments described herein, the logical operations of the compressor module 100 may be implemented as a sequence of computer implemented steps or program modules running on a microprocessor, such as, without limitation, a processor in a personal computer or a computer workstation. In this embodiment, the logical operations of the decompressor module 200 may be implemented as a sequence of computer implemented steps or program modules running on a processor, such as, without limitation, a dedicated processor or digital signal processor (DSP) in the disc drive 320. It will be understood by those skilled in the art that the compressor module and decompressor module of the present invention may also be implemented as interconnected machine logic circuits or circuit modules within a computing system. The implementation is a matter of choice dependent on the performance requirements of the computing system implementing the compressor module 100 and/or decompressor module 200. The operation, structural devices, acts, and/or modules of described herein may be implemented in software, in firmware, in special purpose digital logic, and/or any combination thereof without deviating from the spirit and scope of the present invention as recited within the claims attached hereto. Furthermore, the various software routines or software modules described herein may be implemented by any means as is known in the art. For example, any number of computer programming languages, such as "C", "C++", Pascal, FORTRAN, assembly language, Java, etc., may be used. Furthermore, various programming approaches such as procedural, object oriented or artificial intelligence techniques may be employed.

Computer-readable media can be any available media that can be accessed by the computer or processor. By way of example, and not limitation, computer-readable media might comprise computer storage media and/or communication media.

Computer storage media includes volatile and nonvolatile, removable and non-removable media implemented in any method or technology for storage of information such as computer readable instructions, data structures, program modules or other data. Computer storage media includes, but is not limited to, RAM, ROM, EPROM, flash memory or other memory technology, CD-ROM, digital versatile disks (DVD) or other optical storage, magnetic cassettes, magnetic tape, magnetic disk storage or other magnetic storage devices, or any other medium that can be used to store the desired information and that can be accessed by the computer or processor which is executing the operating code.

Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above should also be included within the scope of computer-readable media. Computer-readable media may also be referred to as computer program product.

The compressor module 100 may be implemented as a software module executed by a general purpose computer 300, as shown in FIG. 3. As described in greater detail below, the compressor module 100 may be employed to compress a stream of uncompressed or raw data 102, such as disc drive operating code data, for delivery to, and storage in, a memory in the disc drive 320. In the system shown in FIG. 3, operating code for the disc drive 320 is input to the computer 300, which, in turn, employs the compression module 100 to compress the operating code for transmission to the disc drive. Some of the elements of a general purpose computer 300 shown in FIG. 3 include a monitor 302, a keyboard 304, a processor 306 having an input/output (I/O) section 308, a Central Processing Unit (CPU) 310, a memory section 312, and a non-volatile storage device 314, such as a disc drive, a CD-ROM, or the like. Although many other internal components of the general purpose computer 300 are not shown, those of ordinary skill in the art will appreciate that such components and their interconnections are well known.

Figure 4:
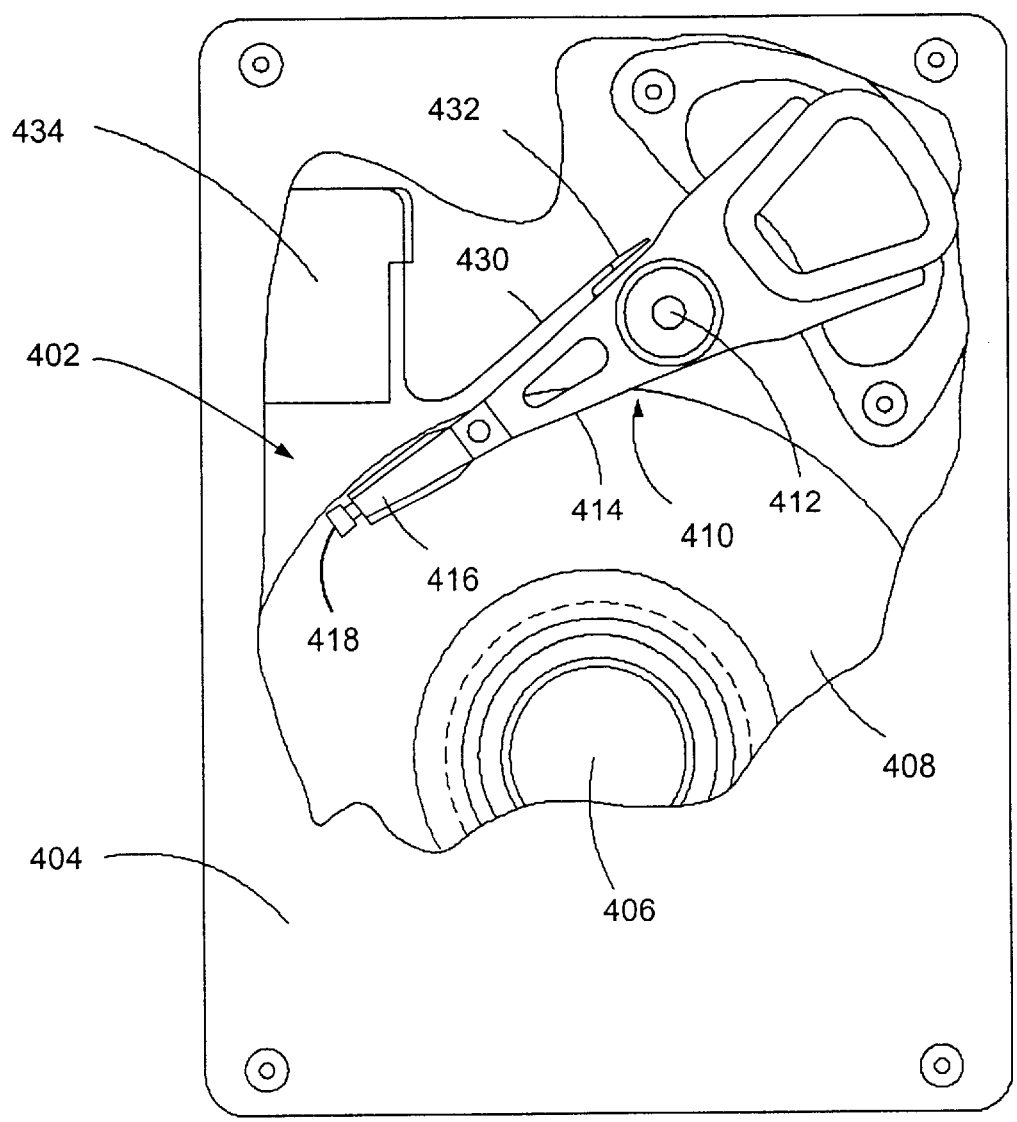
FIG. 4 is a plan view of a disc drive incorporating an embodiment of the decompressor module shown in FIG. 2.

In this embodiment, the decompressor module 200 is implemented in a processor or DSP in the disc drive 320 to decompress the compressed operating code, as also described in greater detail below. An exemplary disc drive 320 in which the decompressor module 200 may be employed or implemented is shown in FIG. 4. The disc drive 320 includes a base 402 to which various components of the disc drive 320 are mounted. A top cover 404, shown partially cut away, cooperates with the base 402 to form an internal, sealed environment for the disc drive 320 in a conventional manner. The components include a spindle motor 406 which rotates one or more discs 408 at a constant high speed. Information is written to and read from tracks on the discs 408 through the use of an actuator assembly 410, which rotates during a seek operation about a bearing shaft assembly 412 positioned adjacent the discs 408. The actuator assembly 410 includes a plurality of actuator arms 414 which extend towards the discs 408, with one or more flexures 416 extending from each of the actuator arms 414. Mounted at the distal end of each of the flexures 416 is a head 418 which includes an air bearing slider enabling the head 418 to fly in close proximity above the corresponding surface of the associated disc 408.

A flex assembly 430 provides the requisite electrical connection paths for the actuator assembly 410 while allowing pivotal movement of the actuator assembly 410 during operation. The flex assembly includes a printed circuit board 432 to which head wires (not shown) are connected; the head wires being routed along the actuator arms 414 and the flexures 416 to the heads 418. The printed circuit board 432 typically includes circuitry for controlling the write currents applied to the heads 418 during a write operation and a preamplifier for amplifying read signals generated by the heads 418 during a read operation. The flex assembly terminates at a flex bracket 434 for communication through the base 402 to a disc drive printed circuit board (not shown) mounted to the bottom side of the disc drive 320.

Figure 5:
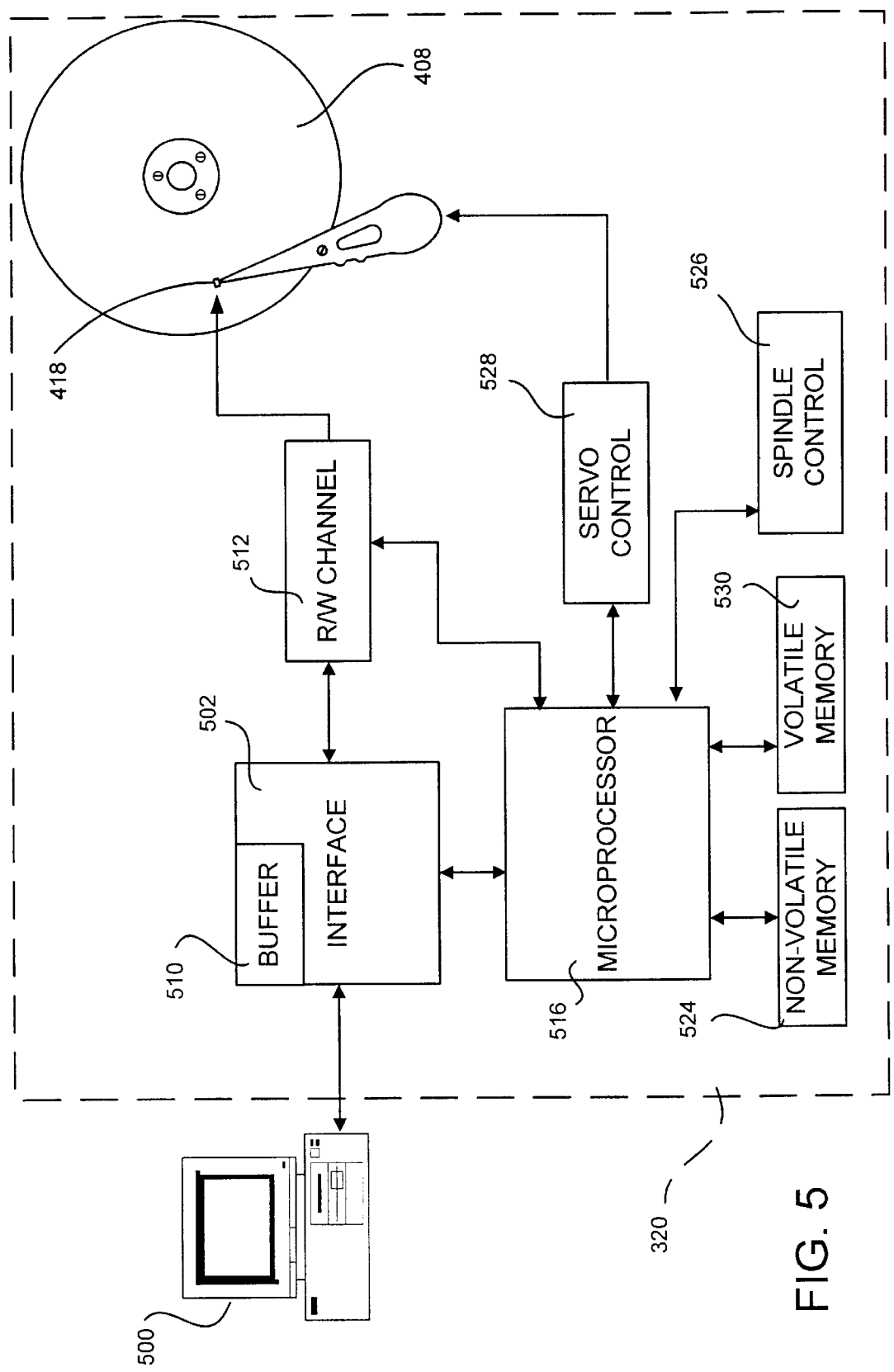
FIG. 5 is a simplified functional block diagram of the disc drive shown in FIG. 4.

Referring now to FIG. 5, shown therein is a functional block diagram of the disc drive 320 of FIG. 4, generally showing the main functional components or modules which are typically resident on a disc drive printed circuit board and which are used to control the operation of the disc drive 320. As shown in FIG. 5, communication with the disc drive 320 is provided via an interface application specific integrated circuit (interface) 502. The interface 502 typically includes an associated buffer 510 which facilitates high speed data transfer between the disc drive 320 and a system, such as a host computer 500, employing the disc drive 320 for the storage of data. In normal operation, data to be written to the disc drive 320 are passed from the host computer 500 to the interface 502 and then to a read/write channel 512, which encodes and serializes the data and provides the requisite write current signals to the heads 418. To retrieve data that has been previously stored by the disc drive 320, read signals are generated by the heads 418 and provided to the read/write channel 512, which performs decoding and error detection and correction operations and outputs the retrieved data to the interface 502 for subsequent transfer to the host computer 500. Such operations of the disc drive 320 are well known in the art and are discussed, for example, in U.S. Pat. No. 5,276,662 issued Jan. 4, 1994 to Shaver et al.

As also shown in FIG. 5, a processor 516 (such as a DSP) is operably connected to the interface 502. The microprocessor 516 provides top level communication and control for the disc drive 320. Additionally, the processor 516 provides control signals for spindle control 526, and servo control 528. Operably connected to the processor 516 are two types of memory, non-volatile memory (NVM) 524 and volatile memory (VM) 530. The NVM 524 may include, without limitation, read only memory (ROM) or flash-ROM. The VM 530 may include, without limitation random access memory (RAM), such as dynamic RAM or static RAM.

In one embodiment, the operation of a disc drive 320 is controlled by operating code, called "boot code," that is initially stored in the NVM 524 in a compressed form. In an embodiment, the boot code, which is read in and executed as part of the startup of the disc drive 320, includes instructions that control the operation of the decompressor module 200. The startup of the disc drive 320 is referred to as the bootstrap procedure.

The bootstrap procedure generally can be described as three distinct steps. First, the processor 516 begins execution from a known location in memory that stores instructions initializing the processor, memory, and any other hardware peripheral devices required such as extended memory controllers, chip controllers, bus controllers, timers, etc. Second, the boot code then performs a run-time initialization that is defined by the particular programming language used to write the operating code. This includes initialization of program stacks, heaps, initialization of static initialized variables and performing any other linkages or language or operating kernel dependent operations is needed before the operating code can be executed. The last step is characterized by the normal operating code initializing communication methods with the media access and external access mechanisms that enable the disc drive to perform the activities required by the external system the drive is a part of (a computer, for example).

Embodiments discussed herein may perform the decompression of the compressed operating code after the second step of the bootstrap procedure. This additional step is an extension of the previous step as viewed by normal operating code since the static memory used by the decompressor module 200 must be reclaimed somehow by the normal operating code. In other words, the operating buffers and variables used by the decompressor module 200 are 'reclaimed' by the operating code by a method of the operating code simply overwriting these data. In effect, all traces of the decompression module 200 (except for the original decompression boot code and compressed operating code in non-volatile memory) are gone once the normal operating code begins execution.

In an embodiment of the invention the operating code is compressed using the compressor module 100. As noted above, the compressor module 100 uses a unique dual-mode compression scheme comprising a first mode and a second mode. In one embodiment, the first mode comprises a modified LZ77-type compression scheme (LZ77 mode) that operates on raw input data 102 to generate a preliminary compressed file comprising root items and copy items. As described below, the preliminary compressed file is further compressed in the second mode (Huffman mode) of the dual-mode compression scheme. While the first mode is described herein with respect to the LZ77 mode, it is to be understood that any compression scheme that outputs a preliminary compressed file including root items and copy items may be used.

Figure 6:
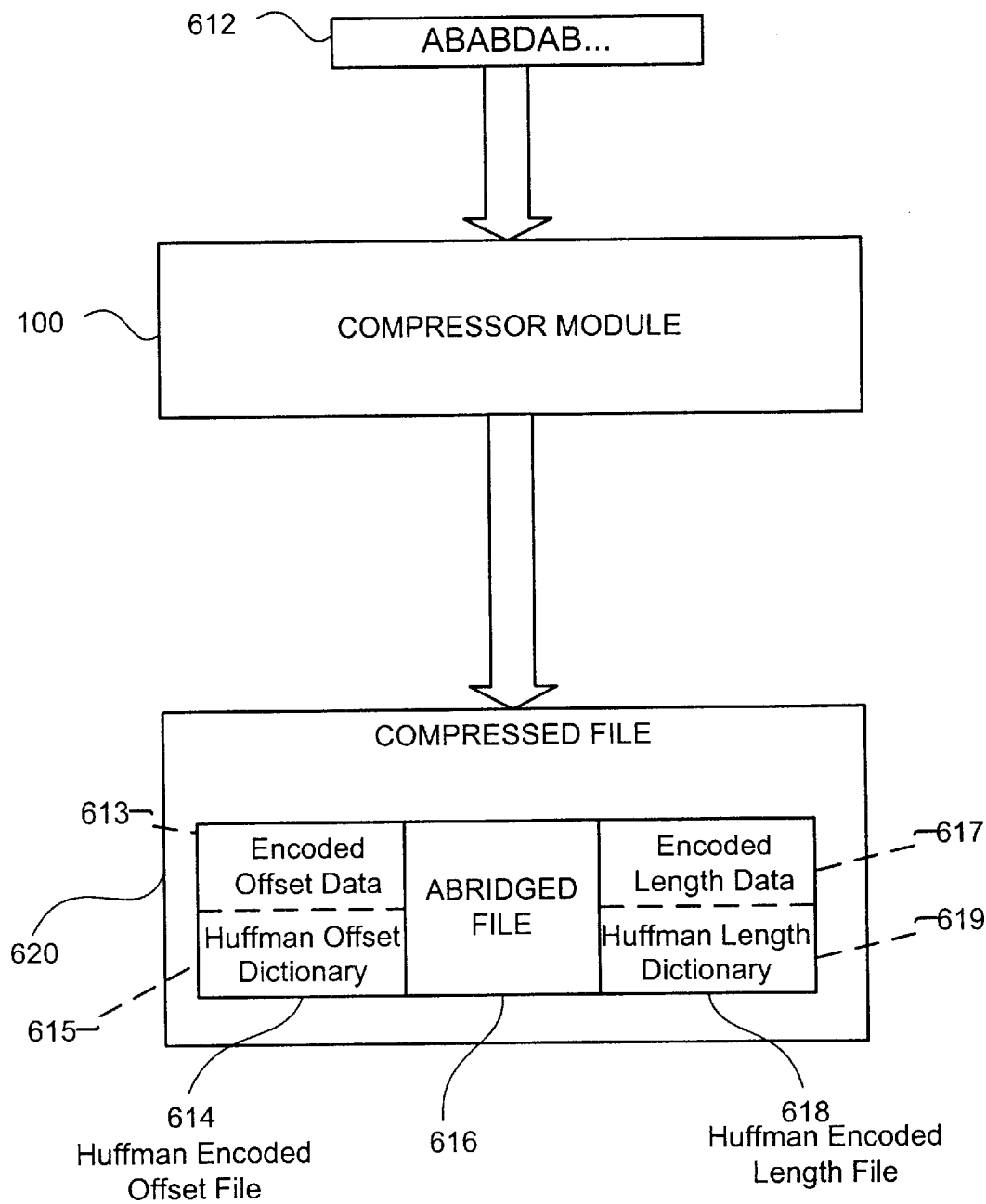
FIG. 6 is a general operation flow diagram illustrating a high level exemplary process used by a compressor module of FIG. 1 to encode input data to generate compressed data.

FIG. 6 is a general operation flow diagram showing a high level exemplary process of encoding input data to generate compressed data in accordance with one embodiment of the present invention. As shown in FIG. 6, the compressor module 100 receives an input data stream 612 that is to be encoded. The input data stream 612 is an uncompressed stream of computer readable data. The compressor module 100 encodes the input data stream 612 using the unique dual-mode compression scheme described herein, and outputs a compressed file 620. The compressed file 620 represents a compressed form of the input data stream 612 and, importantly, is substantially smaller than the input data stream 612. The compressed file 620 will subsequently be used by the decompressor module 200 to recover the computer readable data in the input stream 612.

The compressed file 620 is made up of three data sets: Huffman encoded offset file 614, an abridged root/copy file 616, and Huffman encoded length file 618. The abridged root/copy file 616 contains root items and partial copy items, which are described below with respect to FIG. 7 and 8. The Huffman encoded length file 618 contains encoded length values in encoded length data 617 associated with root items and copy items in the abridged root/copy file 616. The Huffman encoded length file 618 also contains a Huffman length dictionary 619 that contains Huffman decoding data for decoding the encoded length values in the encoded length data 617. The third data set is Huffman encoded offset file 614 associated with the abridged root/copy file 616. The Huffman encoded offset file 614 contains encoded offset data 613 and a Huffman offset dictionary 615, which is used to decode the encoded offset data 613.

While the three files 614, 616, and 618 are illustrated as being sequential and distinct in the compressed file 620, it is to be understood that the compressed file 620 may be stored in anywhere memory.

As was noted, embodiments of the compressor module 100 utilize a dual-mode scheme to create the compressed file 620. The first mode is the LZ77 mode that creates a preliminary compressed file as described with regard to FIG. 7. The preliminary compressed file is the input to the second mode of the compression, the Huffman encoding mode. An embodiment of the Huffman encoding mode is described with regard to FIG. 8.

Figure 7:
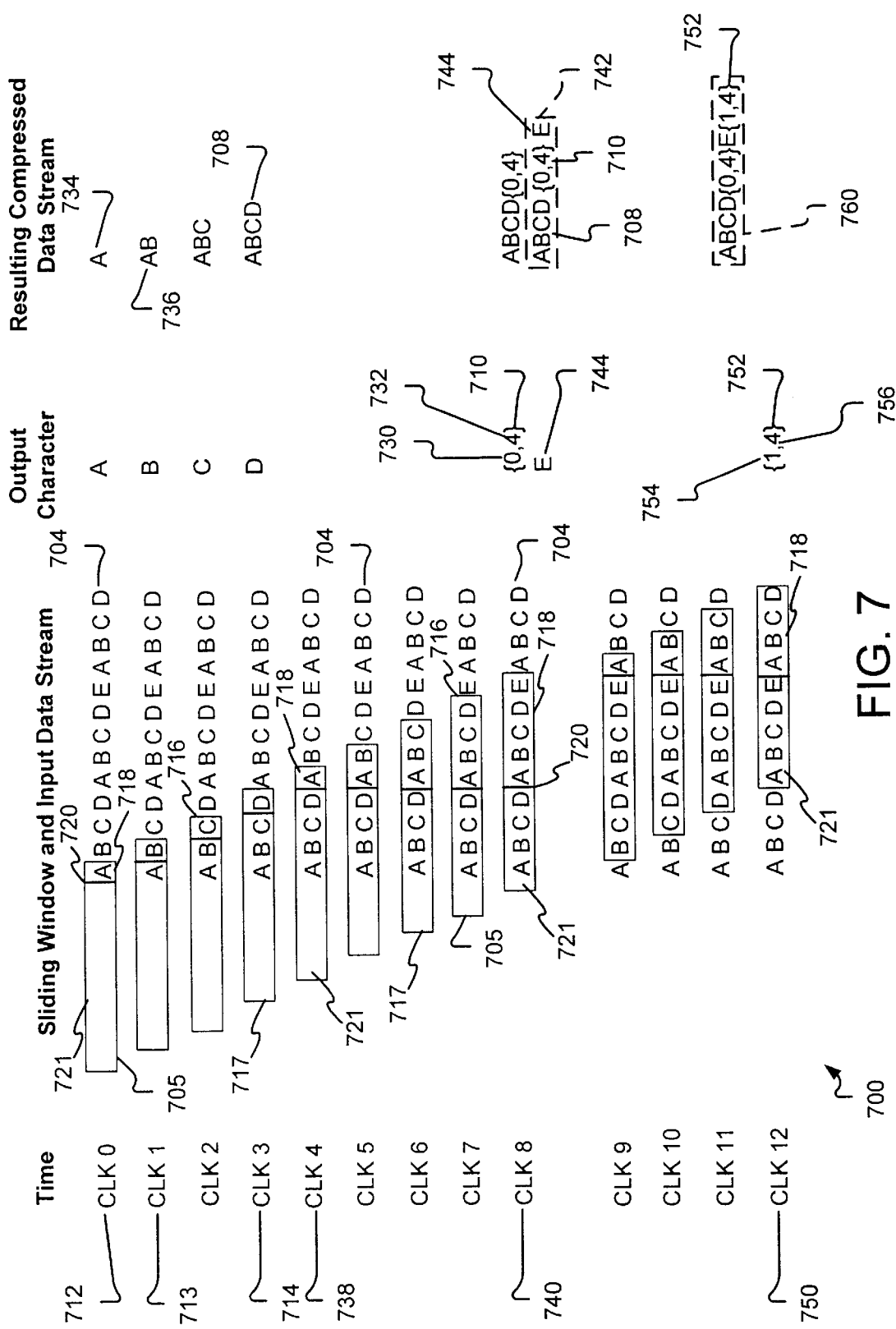
FIG. 7 is an exemplary illustration of how the LZ77 mode of the compressor module shown in FIG. 1 compresses an input data stream into a preliminary compression file.

An exemplary illustration of how the LZ77 mode 700 compresses an input data stream into a preliminary compression file is provided in FIG. 7. The preliminary compressed file is referred to herein as the preliminary root/copy file because it contains root items and copy items, which are a compressed version of the input data stream. The input data stream is an uncompressed stream of computer readable data. Computer readable data includes, but is not limited to, microprocessor executable code or firmware, such as code or firmware that may be stored in memory on the disc drive 320 of FIG. 3. FIG. 7 is intended to assist the reader in understanding how input data may be compressed in the LZ77 mode 700, and is not intended to limit the scope of the invention in any way. Many varieties of LZ77 are known in the art. Variants of the LZ77 algorithm include, but are not limited to, LZ78, LZH, LZB, LZSS, and LZFG, however, the most popular compression schemes are variants of the LZ77 types. Examples of popular LZ77 type compression schemes are ARJ, LHA, ZIP, ZOO. It is to be understood that the LZ77 mode 700 may employ any compression algorithm that generates root and copy items in accordance with embodiments described herein.

FIG. 7 illustrates an input data stream 704 comprising a plurality of symbols, being processed at a number of instances in time, such as clock cycle (CLK) 0 712 and CLK 3 714. A symbol generally means any abbreviated representation useful to represent any computer readable information. Examples of symbols include characters and numbers. A symbol is typically binary encoded in computer memory in the form of one or more computer readable bits. Clock cycle generally refers to a periodic time reference triggering the occurrence of computer operations. For example, on each clock cycle, one or more symbols in the input data stream 704 are read from memory to be encoded, while compressed data is written to memory.

To assist the reader in understanding how the input data stream 704 is encoded, a sliding window 705 is superimposed over the input data stream 704. The sliding window 705 may be viewed as having a leading edge 716 and a trailing edge 717 within which symbols are contained. The leading edge 716 and trailing edge 717 may logically represent locations in any memory (including registers within a microprocessor) at which the contained symbols are stored. It is envisioned that the sliding window 705 will be defined in software by using any memory-referencing scheme to logically associate the leading edge 716 and the trailing edge 717 with symbols in the input data stream 704. Any number of symbols may be contained in the sliding window 705.

For illustrative purposes only, the sliding window 705 of FIG. 7 contains nine symbols. In an actual embodiment, the sliding window 705 can be any size (for example, 1024). The size of the sliding window 705 typically depends on the size of registers in the microprocessor or digital signal processor used in the embodiment. The sliding window 705 may also include a partition 720 dividing the sliding window 705 into two parts or buffers. Like the leading edge 716, the partition 720 may be viewed as a reference to a memory location within the memory storing the symbols of the input data stream 704. The two buffers of the sliding window 705 are referred to as a look-ahead buffer 718, and a search buffer 721. The search buffer 721 contains symbols that have recently been encoded. The look-ahead buffer 718 contains symbols yet to be encoded.

For example, in one embodiment the look-ahead buffer may be limited to 128 bytes. The size is a function of the number of bits in the length field or the extent field. The greater the number of bits required for expressing the length of the located string in the sliding window, the greater the number of wasted bits when the extent does not require all the bits for representation. The size of the look-ahead buffer may chosen arbitrarily or derived empirically to suit the application, environment, particular data to be compressed, etc.

With each clock cycle, the sliding window 705 progresses or slides in the direction of the leading edge 716 over another symbol of the input data stream 704. For example, at CLK 0 712, the sliding window 705 is superimposed over a symbol "A" of the input data stream 704. At CLK 1 713, the sliding window 705 is superimposed over the symbol "A", and the symbol adjacent the symbol "A," which is, in the example, a symbol "B." As the sliding window 705 progresses over symbols of the input data stream 704, symbols enter the look-ahead buffer 718. Symbols in the look-ahead buffer 718 are encoded. In an actual embodiment, the symbols in the sliding window 705 are in memory and symbol sequences contained in the look-ahead buffer 718 are encoded. A symbol sequence is one or more logically adjacent symbols. The maximum number of symbols can be set to any number and depends on the size of the sliding window 705.

The compressor module 100 reads the symbol sequences in the look-ahead buffer 718 and searches for those symbol sequences in the search buffer 721. If no symbol sequence of the look-ahead buffer 718 is located in the search buffer 721, the compressor module 100 outputs the symbol sequence as a root item, such as the root items 708. A root item 708 is generally a symbol sequence from the look-ahead buffer 718, for which no matches of two or more symbols are located within the search buffer 721. If a symbol sequence of the look-ahead buffer 718 is found in the search buffer 721, the compressor module generates a copy item, such as the copy items 710. A copy item, such as the copy item 710, comprises an offset value 730 and a length value 732. In the illustration, the copy item 710 is shown as contained by brackets in order to assist the reader in distinguishing between copy items 710 and root items 708.

In an actual embodiment, the root items 708 and copy items 710 are binary encoded and stored in a preliminary root/copy file in memory along with distinguishing identifiers. Each root item 708 is stored in the preliminary root/copy file with an associated computer readable identifier, uniquely identifying the item as a root item 708. Likewise, each copy item 710 is stored in the preliminary root/copy file with an associated computer readable identifier, uniquely identifying the item as a copy item 710. Thus, the associated identifier distinguishes root items 708 from copy items 710. The associated identifier can be any unique binary encoded identifier. For example, the associated identifier can be a single bit, wherein a bit value of 1 indicates that the item is a root item 708 and a bit value of 0 indicates the item is a copy item 710.

At CLK 0 712 no symbols are contained in the search buffer 721. Thus, the compressor module does not locate the symbol "A" of the look-ahead buffer 718 in the search buffer 721. Thus, at CLK 0 712 a root item A 734 is output to a memory location, preferably being in a file for holding the compressed data. At CLK 1 713 the symbol sequence "B" of the look-ahead buffer 718 is not found in the search buffer 721. Therefore, a symbol "B" is output and stored with the previous root item A 734 to form a root item AB 736. Processing continues in this fashion through CLK 3 714, at which time the root item ABCD 708 is stored in the compressed data file. At CLK 4 738 a symbol "A" is in the look-ahead buffer 718. The symbol "A" is also found in the search buffer, but no items are output at CLK 4 738. Rather, processing continues to identify the duplicated symbol sequence in the sliding window 705.

Processing continues with no output items until CLK 8 740. At CLK 8 740, symbol sequence "ABCD" of the look-ahead buffer 718 matches a symbol sequence in the search buffer 721. The symbol sequence "ABCD" is compressed into a copy item 710 and stored along with the previously stored root item 708. As discussed previously, the copy item 710 is comprised of the offset value 730 and the length value 732. The length value 732 represents the number of symbols in the symbol sequence represented by the copy item 710. The offset value 730 represents the relative proximity of the root item 708 that is duplicated by the copy item 710. In the embodiment of FIG. 7, offsets start at zero (i.e., the closest root items are at an offset value of zero). Those skilled in the art will recognize that in other embodiments offset values can be represented any number of ways. For example, the offset value could represent an offset into a file containing the input data stream. Also, the offset value could represent the relative distance from the copy item to the beginning of the root symbol sequence or the end of the root symbol sequence. In a preferred embodiment, offset values are selected to maximize the data compression.

At CLK 8 740, the root item ABCD 708 is the root item associated with the symbol sequence "ABCD" of the look-ahead buffer 718. The symbol sequence "ABCD" of the search buffer 721 at CLK 8 740 is immediately adjacent the symbol sequence "ABCD" in the look-ahead buffer 718. Therefore, the offset value 730 of the copy item 710 is zero, indicating that the associated root item is the root item 708, which is immediately adjacent the copy item 710.

In one embodiment, the offset value 730 refers to the index location in the sliding window 705 at the time a full match has been located and exhausted. In other words, the sliding window 705 does not advance as new candidate symbols are introduced by the input stream into the look-ahead string. The sliding window index is advanced and the look-ahead string copied into the window 705 when either of the two cases occurs: 1. There is no match between any string in the sliding window and the look-ahead string and the look-ahead string is shorter than the minimum candidate string; or 2. A match has been found and exhausted. In both of these cases, the look-ahead string is copied into the sliding window 705 and the sliding window index advanced after the copy item 710 has been computed and emitted, i.e., sliding window 705 update is done last. If this were not the case, a match under consideration could slide partially out of the window 705 making the match impossible to complete.

Also stored with the root item 708 and the copy item 710 at CLK 8 740 is a root item E 744, which is a single symbol of the look-ahead buffer 718, which is not in the search buffer 721. The combined copy item 710, root item 708, and second root item 744 together form a root/copy item 742. As discussed, the root/copy item 742 is preferably stored in a file. In other words, during the CLK 8 740, the time that root item E 744 is determined, it is noted that the look-ahead stream no longer matches any string in the sliding window. During this clock cycle the compressed file is updated and the sliding window buffer is updated with the contents of the look-ahead buffer.

To further illustrate the process, FIG. 7 includes additional clock cycles, CLK 9, CLK 10, CLK 1, and CLK 12 750. After CLK 8 740, processing continues in the manner.

described above to locate the largest duplicated symbol sequences in the input data stream 704 and encodes them using root/copy items. The compressor module 100 locates the next longest duplicate symbol sequence at CLK 12 750, which is symbol sequence "ABCD" of the look-ahead buffer 718. At CLK 12 750, the symbol sequence "ABCD" of the look-ahead buffer 718 is searched for and found in the search buffer 721.

At CLK 12 750 another copy item 752 is generated having another offset value 754 and another length value 756. The length value 756 is four because the duplicate symbol sequence "ABCD" of the look-ahead buffer 718 at CLK 12 750 is four symbols long and the associated root item ABCD 708 is four symbols long. The offset value 754 is one because one root item, the root item E 744, is between the copy item 752 and the copy item's 752 associated root item ABCD 708. The copy item 752 is stored along with the previously stored root/copy item 742 to form root/copy item 760. Processing continues in the fashion described above until all the input data is encoded into root/copy items that are preferably stored in a preliminary root/copy file. It should noted that there are many other techniques for generating and representing root items and copy items that are well known in the art and may also be used. As will be discussed, the preliminary root/copy file is used as input to the Huffman compression mode to further compress the input data.

Figure 8:
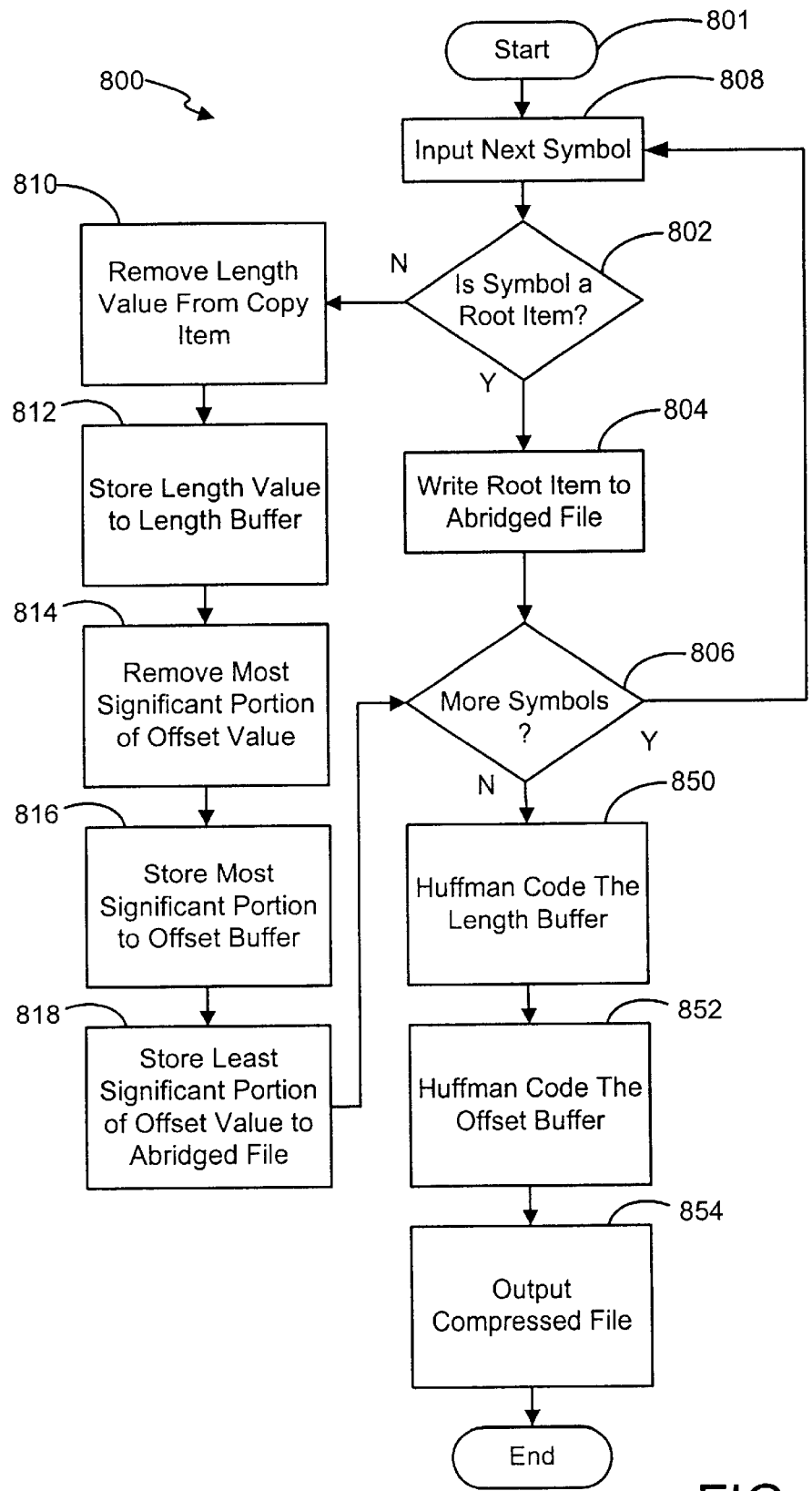
FIG. 8 illustrates one example of an operational flow of the Huffman encoding mode of the compressor module of FIG. 1.

FIG. 8 illustrates one example of an operational flow 800 of the Huffman encoding mode of the compressor module 100. In general, the Huffman encoding mode includes reading the root/copy items from the preliminary root/data file (described with regard to FIG. 7) and generating one or more associated Huffman encoded data files. As a result, the preliminary root/copy file is compressed into a final compressed data file, such as the compressed file 620 (FIG. 6). Start operation 801 initializes the Huffman encoding mode. An input operation 808 reads a predetermined number of bits from the preliminary root/copy file created by the LZ77 mode. In one embodiment, nine bits are read in the input operation 808, with eight bits representing a symbol and one bit indicating whether the symbol is a root item or a copy item. Other embodiments may use more or fewer bits for the root/copy items and their respective indicators.

After the input operation 808, determination operation 802 determines if the input symbol from the input operation 808 is a root item. Determining whether the symbol is a root item preferably involves testing one or more indicator bits retrieved in the input operation 808. Any number of methods of testing the indicator bits can be used, including, but not limited to, masking off the symbol bits to obtain only the indicator bits, or any other known bit manipulation. If the symbol is determined to be a root item, then write operation 804 writes the root item to an abridged root/copy file, such as the abridged root/copy file 616 described in FIG. 6. The indicator bits are also written to the abridged root/copy file 616 so that the decompressor module 200 can later determine in the decompression process which symbols are root items and which symbols are copy items.

After the root item has been written to the abridged root/copy file 616, a completion determination operation 806 determines if there are any symbols remaining in the preliminary root/copy file to be either Huffman encoded or written to the abridged root/copy file 616. If the determination operation 806 determines that there are more symbols in the preliminary root/copy file to be processed, then the operation flow 800 returns to the input operation 808. If, however, the completion determination operation 806 determines that there are no more symbols to be processed in the preliminary root/copy file, then Huffman length encoding operation 850 is performed, which will be discussed below in detail.

Returning now to the determination operation 802, if the determination operation 802 determines that a symbol is not a root item, then the symbol must be a copy item, in which case the length removal operation 810 removes the length value (such as the length value 756 of FIG. 7) from the copy item so that the length value can be subsequently Huffman encoded. Next, the length value is stored in a length buffer that is distinct from the abridged root/copy file 616 by a length storage operation 812. In the length storage operation 812, the length value may also be counted to develop the statistics required for the subsequent Huffman encoding. Counting in the length storage operation 812 preferably involves maintaining a counter corresponding to each unique length value and incrementing the counter corresponding to the length value that is stored.

After the length storage operation 812, an offset removal operation 814 removes the most significant portion (MSP) of the offset value (such as the offset value 754 of FIG. 7) from the copy item. The most significant portion of the offset value includes a number of the most significant bits of the offset value. The number of most significant bits removed from the offset value in the offset removal operation 814 depends on the particular embodiment and the desired compression ratio of the compressed file 620. Testing has shown that by removing and Huffman encoding the most significant five bits of the offset value, substantial compression ratios can be achieved because of favorable statistical characteristics (infrequency in change) of the most significant portion. Those skilled in the art will recognize that the most significant portion of the offset value may vary in size depending on metrics desired for the particular application, such as, but not limited to, the desired compression/decompression time and the desired compression ratio.

After the offset removal operation 814, an MSP offset storage operation 816 stores the MSP in an offset buffer. The MSP offset storage operation 816 may include a counting operation, wherein the MSPs are counted for subsequent Huffman encoding. Counting preferably involves maintaining a counter corresponding to each unique MSP and incrementing the counter corresponding to each MSP stored in the MSP offset storage operation 816. The offset buffer is distinct from the length buffer and the abridged root/copy file 616. A least significant portion (LSP) offset storage operation 818 then stores what remains of the copy item, which is the least significant portion of the offset value, in the abridged root/copy file 616 compressed copy item. Upon completion of the LSP offset storage operation 818, the completion determination operation 806 determines if any more root items or copy items remain to be encoded in the preliminary root/copy file.

If the completion determination operation 806 determines that there are no more root items or copy items remaining to be processed, a Huffman length encoding operation 850 Huffman encodes the contents of the length buffer previously created in the length storage operation 12. The Huffman length encoding operation 850 creates encoded length data, such as the encoded length data 617 of FIG. 6. Huffman encoding the length buffer generally involves reading the length buffer and counting the occurrences of every length value in the length buffer. Then, a statistical likelihood value is calculated for each length value representing the likelihood that each length value will occur. The length values are then sorted according to their likelihood from most likely to least likely and stored in a Huffman dictionary along with a Huffman code. Table 1 illustrates an example of the data that may be generated during Huffman encoding:

TABLE 1

| Index | Length Value or MSP (Hexadecimal) | Probability | Code Length | Huffman Code (Binary) |
|---|---|---|---|---|
| 0000 | 0003 | 21.062559 | 0002 | 00 |
| 0001 | 0006 | 16.315624 | 0003 | 111 |
| 0002 | 0007 | 12.826155 | 0003 | 100 |
| 0003 | 0028 | 10.657026 | 0003 | 011 |
| 0004 | 001c | 6.790318 | 0004 | 1011 |
| 0005 | 0004 | 5.438541 | 0004 | 0101 |
| 0006 | 000c | 4.401132 | 0005 | 11010 |
| 0007 | 0005 | 3.363722 | 0005 | 11000 |
| 0008 | 0019 | 2.986482 | 0005 | 10100 |
| 0009 | 000d | 2.326312 | 0006 | 110111 |
| 0010 | 0008 | 1.823326 | 0006 | 110011 |
| 0011 | 001b | 1.697579 | 0006 | 110010 |
| 0012 | 000b | 1.446086 | 0006 | 101010 |
| 0013 | 001e | 1.351776 | 0006 | 010010 |
| 0014 | 0009 | 1.288903 | 0006 | 010010 |
| 0015 | 000a | 1.131720 | 0007 | 1101101 |
| 0016 | 0027 | 0.943100 | 0007 | 1010111 |
| 0017 | 001d | 0.723043 | 0007 | 1010110 |
| 0018 | 0018 | 0.628733 | 0007 | 0100011 |
| 0019 | 001a | 0.597296 | 0007 | 0100010 |
| 0020 | 0017 | 0.565860 | 0007 | 0100000 |
| 0021 | 000e | 0.565860 | 0008 | 11011001 |
| 0022 | 0010 | 0.157183 | 0009 | 010000101 |
| 0023 | 0016 | 0.157183 | 0009 | 010000110 |
| 0024 | 0026 | 0.157183 | 0009 | 010000111 |
| 0025 | 0011 | 0.125747 | 0009 | 010000100 |
| 0026 | 000f | 0.125747 | 0010 | 1101100011 |
| 0027 | 0012 | 0.094310 | 0010 | 1101100000 |
| 0028 | 0014 | 0.062873 | 0011 | 11011000011 |
| 0029 | 001f | 0.062873 | 0011 | 11011000100 |
| 0030 | 0020 | 0.062873 | 0011 | 11011000101 |
| 0031 | 0013 | 0.031437 | 0012 | 110110000101 |
| 0032 | 0015 | 0.031437 | 0012 | 110110000100 |

The first column is optional and provides index values that could be used to index into a table containing the data in Table 1. The second column lists the unencoded data (either the length values or the MSP offset values in Hexadecimal format). The third column lists an associated likelihood of occurrence for each of the values in column 2. Each of the probabilities given in column 3 indicate the likelihood that any Huffman encoded value in the encoded offset data 613 or the encoded length data 617 represents the associated unencoded data. The data in column 3 is sorted from highest to lowest probability. The values in column 5 are the Huffman encoded versions (in binary) of each of the associated unencoded values in column 2. The codes in column 5 are stored during compression in the encoded length data 617 and the encoded offset data 613. Column 4 lists a length value associated with each of the codes in column 5. Each length value in column 4 indicates the number of bits in the associated Huffman code in column 5.

As can be seen in Table 1, the most likely occurring length or MSP value (0003) corresponds to the Huffman code (00) with the least number of bits. As the probability of occurring gets smaller (as shown by the decreasing probability values in column 3) for each length or MSP value, the bitsize of the corresponding Huffman code gets larger (as shown by the increasing bit lengths in column 4). Advantages of Huffman encoding include less overall average memory is required to store the encoded data than the original data, and each of the Huffman codes are unique. A Huffman length dictionary, such as the Huffman length dictionary 619 of FIG. 6, is preferably built in the Huffman length encoding operation 850. Building the Huffman length dictionary 619 involves packing each Huffman code (for example, column 5 of Table 1) and its corresponding length (for example, column 4 of Table 1) and length value (for example, column 2 of Table 1) into a length dictionary buffer or file. The Huffman length dictionary 619 will subsequently be used by the decompressor module 200 to associate Huffman length codes with corresponding length values.

The length buffer created in the length storage operation 812 is Huffman encoded in Huffman length encoding operation 850 to create the encoded length data 617. One way of Huffman encoding the length buffer involves building a Huffman tree, which is known in the art. Generally, to build the Huffman tree for the length buffer, a tree is constructed with a unique length value at every leaf. The least likely pair of length values is paired and their probabilities added together. Then, the next least likely length value is paired with the previously paired length values and probabilities of the three length values added. The pairing and probability summing continues until all the length values have been paired and their respective probabilities summed. Note that the final sum of probabilities will be 1.0. Then, binary codes are assigned to each branch of the tree. To obtain the Huffman code for each length value, the branches are "traversed" from the length value to the base of the tree, with each binary code gathered into the Huffman code. The Huffman length dictionary 619 created in the Huffman length encoding operation 850 is combined with the encoded length data 617. The combination of the Huffman length dictionary 619 and the encoded length data 617 is the Huffman encoded length file 618, discussed in the description of FIG. 6.

After the Huffman length encoding operation 850, a Huffman offset encoding operation 852 Huffman encodes the contents of the offset buffer, i.e. the MSPs of the offset values, created in the MSP offset storage operation 816. The Huffman offset encoding operation 852 creates a Huffman offset dictionary 615, which provides Huffman codes corresponding to each unique MSP of the offset values previously stored in the storage operation 816. The Huffman offset dictionary 615 is created in the same manner that the length dictionary 619 was created in the Huffman length encoding operation 850, described above. The offset buffer created in the MSP offset storage operation 816 is encoded to create an encoded offset data 613. Encoding the offset buffer may be accomplished in a manner similar to that described with respect to the encoded length data 617. The Huffman offset dictionary 615 created in the Huffman offset encoding operation 852 is combined with the encoded offset data 613. The combination of the offset dictionary 615 and the encoded offset data 613 comprises the Huffman encoded offset file 614, as shown in FIG. 6.

After the Huffman encoded offset file 614 and the Huffman encoded length file 618 are created, output operation 854 combines the Huffman encoded offset file 614 and the Huffman encoded length file 618 with the abridged root/copy file 616 to form the compressed data file 620. The compressed data file 620 is stored in memory to be used subsequently by the decompressor module 200 to retrieve the original raw input data.

Figure 9:
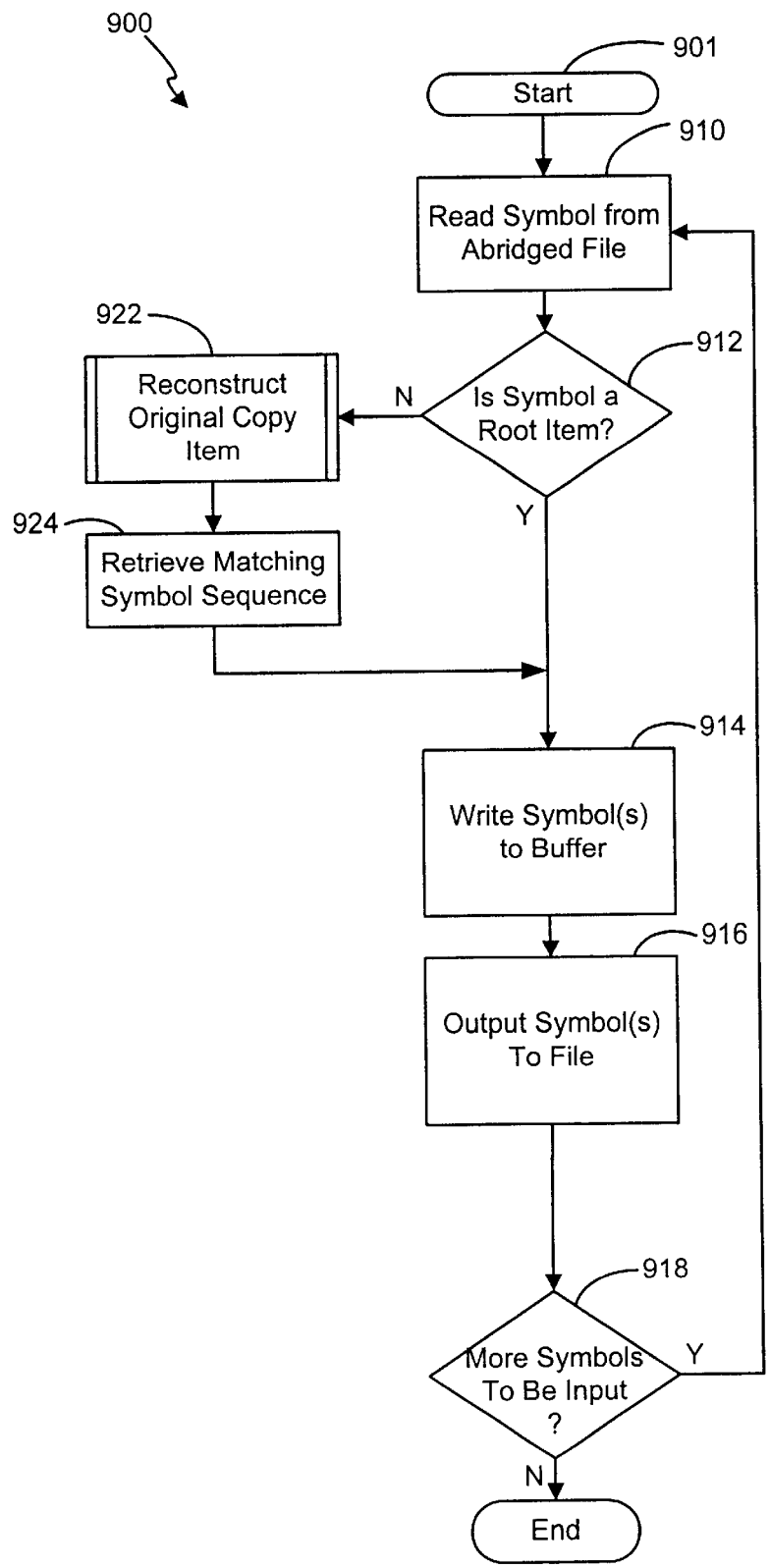
FIG. 9 illustrates one example of an operational flow of the decoding process employed by the decompressor module of FIG. 2.

FIG. 9 illustrates one example of an operational flow 900 of the decoding process employed by the decompressor module 200. In one embodiment, referred to herein as the unpacked dictionary embodiment, all of the Huffman dictionary entries are unpacked before continuing with the decompression. In another embodiment, referred to herein as the packed dictionary embodiment, all of the Huffman encoded data is decoded initially. Thus, the order of decoding and decompressing is generally not rigid, but may vary from embodiment to embodiment. Those skilled in the art will recognize that the order of performing many of the details described herein could be altered while still achieving the decompressed output file described.

The embodiment shown in FIG. 9 illustrates a packed dictionary embodiment. In the embodiment shown in FIG. 9, the packed Huffman dictionary is accessed when Huffman decoding occurs. At the start 901 of the operational flow 900, a read operation 910 reads in the first symbol of the abridged root/copy file 616 comprised of root items and partial copy items. A root item determination operation 912 then determines if the symbol read in the read operation 910 is a root item. As was discussed in the description of FIG. 8, symbols are preferably stored with an indicator that indicates whether the symbol is a root item or a copy item. In one embodiment, a single indicator bit is appended to each of the root items and copy items in the abridged root/copy file 620 such that the determination operation 912 can read the indicator bit to determine whether the symbol is a root item or a copy item. For example, if the indicator bit is a one, the symbol is a copy item, while if the indicator bit is a zero, the symbol is a root item.

If determination operation 912 determines that the symbol read in the read operation 910 is a root item, a write operation 914 writes the root item into a sliding window buffer. The sliding window buffer in the write operation 914 is a sliding window similar to the sliding window discussed in the description of FIG. 7. The compression sliding window buffer and decompression sliding window buffer must be the same size in order for the length values encoded in the compressed data to match up. The write operation 914 preferably appends the symbol to the logical end of the sliding window buffer. When the buffer is full, the oldest symbol in the buffer will be removed from the buffer each time a new symbol is added in the write operation 914. Thus, the sliding window buffer may be viewed as a "first-in, first-out" buffer.

Following the write operation 914, an output operation 916 outputs the symbol to a microprocessor readable data file, referred to herein as the decompressed output file. If the decompressed output file has not been created before the output operation 916, the output operation 916 will create or open the decompressed output file before writing the root item to it. As will be discussed, the output operation will output to the decompressed output file other symbols decompressed from copy items in the abridged root/copy file 616. As a result, at the end of the operation flow 900 the decompressed file will contain all the symbols that were originally input to the compressor module 100 as discussed in the descriptions of FIG. 6, 7, and 8.

After the output operation 916, a completion determination operation 918 determines if there are any symbols remaining to read from the abridged root/copy file 616. If there are more symbol to be read, the read operation 910 inputs or reads the next symbol from the abridged root/copy file 616. The root item determination operation 912 then determines if the next symbol read in the read operation 910 is a root symbol. Thus, the loop composed of operations 910, 912, 914, 916, and 918, together decompress the root items contained in the abridged root/copy file 616 and builds a sliding window buffer that is used to decompress copy items in the abridged root/copy file 616.

Referring again to the determination operation 912, if a symbol previously read in the read operation 910 is determined not to be a root item, then it is a compressed copy item. Specifically, if the symbol read in the read operation 910 is not a root item, it is assumed to be the least significant portion (LSP) of an offset value of a copy item and a reconstructing operation 922 then uses the LSP to reconstruct the copy item, which comprises an offset value and a length value. Reconstructing a copy item in the reconstructing operation 922 generally involves creating the offset value and the length value of the copy item. Creating the offset value involves combining the LSP read in the read operation 910 with a most significant portion (MSP) of the offset value. As was discussed, the MSP was previously encoded during the compression process and stored in the Huffman encoded offset file 614. The MSP is obtained in the reconstructing operation 922 by decoding an entry in the encoded offset data 613 in the Huffman encoded offset file 614. The reconstructing operation 922 obtains the length value of the copy item by decoding an entry in the encoded length data 617 previously stored in the Huffman encoded length file 614. Thus, to reconstruct the copy item, the reconstructing operation 922 decodes two values: an encoded MSP of the offset value, and an encoded length value. The process of decoding these values will be discussed in detail in the description of FIG. 10, which describes an embodiment of an operation flow 1000 that can be used to decode MSP values and length values. By using a decoding subroutine, such as the routine shown in the operation flow 1000, the reconstructing operation 922 generates a copy item.

Once the copy item has been reconstructed by the reconstructing operation 922, the copy item is used by a retrieving operation 924 to retrieve the original input symbols represented by the copy item. In the retrieving operation 924, a symbol sequence is created by identifying a matching symbol sequence in the sliding window buffer created in the writing operation 914. The matching symbol sequence is located at an offset into the sliding window buffer given by the offset value of the copy item generated by the reconstructing operation 922. The number of symbols in the symbol sequence is given by the length value of the copy item generated by the reconstructing operation 922. The symbol sequence retrieved in the retrieving operation 924 is written to the sliding window buffer in the writing operation 914 and output to the decompressed output file in the output operation 916. After output operation 916, the operational flow 900 continues to the determination operation 918. If the determination operation 918 determines that all of the symbols of the abridged root/copy file 616 have been processed, the decoding process has been completed and the output operation 916 will have created a decompressed output file that is readable and executable by a microprocessor.

Figure 10:
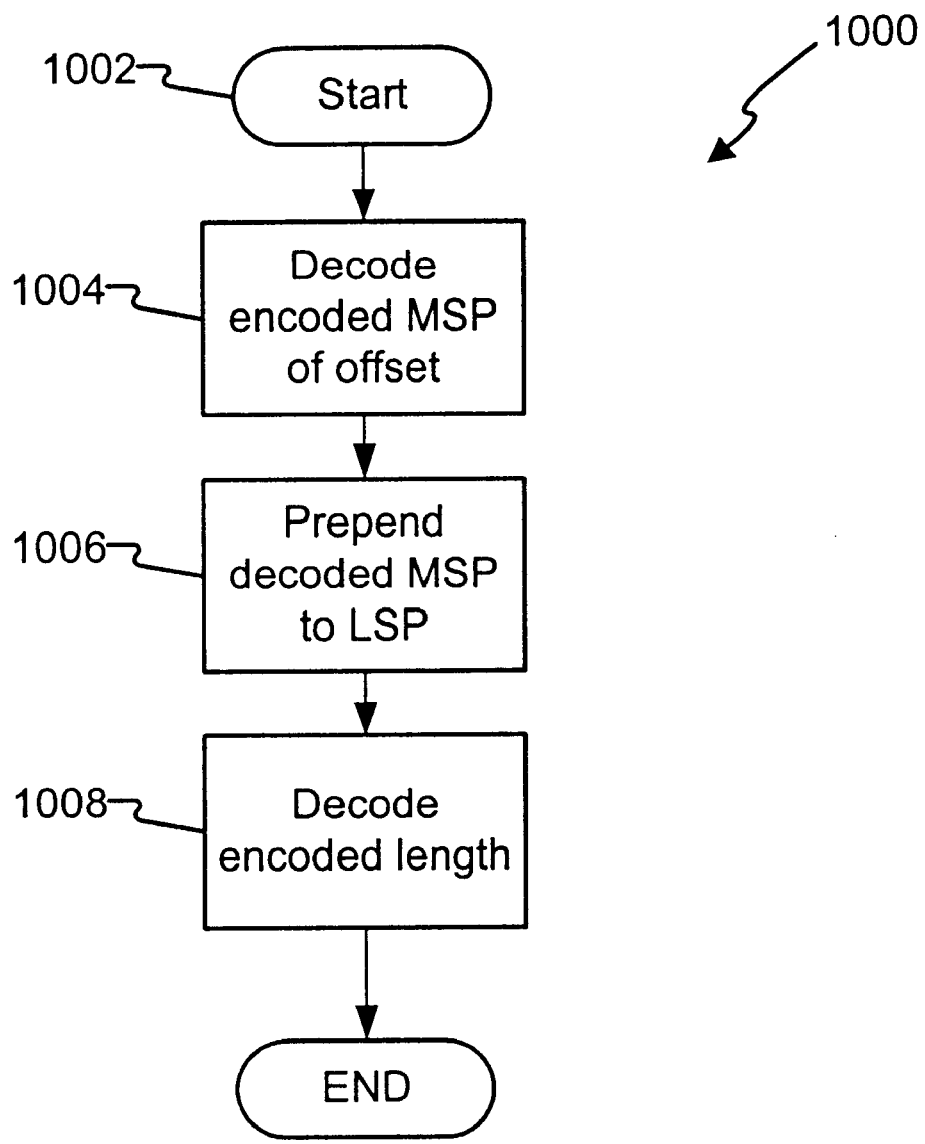
FIG. 10 illustrates an operation flow of one possible process used by the decompressor module of FIG. 2 to retrieve an offset value and a length value of a copy item.

FIG. 10 illustrates one possible operational flow 1000 for the reconstructing operation 922 shown and described with respect to FIG. 9. As was discussed, the Huffman encoded offset file 614 preferably includes an encoded offset data 613 that holds encoded versions of the most significant portion (MSP) of copy item offset values and a packed Huffman offset dictionary 615 for decoding the encoded MSPs. Similarly, the Huffman encoded length file 618 includes the encoded length data 617 that stores encoded versions of copy item length values and a packed Huffman length dictionary 619 for decoding the encoded length values. The offset and length dictionaries 615 and 619 contain all the possible Huffman codes, and each of the code's associated length (in bits) and values (such as column 2 of Table 1) replaced by the code, as discussed in the description of FIG. 8. The data in the dictionaries is packed such that the beginnings of each data item are not necessarily on byte (8-bit) boundaries. Rather, the bits are packed sided-by-side, with no wasted memory between. As a result, the packed dictionaries require an optimally small amount of memory.

In the embodiment of FIG. 8, the encoded MSPs and encoded length values were stored in the respective Huffman encoded data (613 and 617) in the same order that their associated copy items were stored in the abridged root/copy file 616. As a result, the copy items in the abridged root/copy file 616 are arranged in the order of their associated encoded values in the Huffman encoded data. Thus, in general, each time a partial copy item is retrieved from the abridged root/copy file 616 (such as in operation 910), the next encoded MSP and the next encoded length value are retrieved from the respective Huffman encoded data (613 and 617) to reconstruct the copy item.

In FIG. 10, a start operation 1002 performs initialization processing. An offset decoding operation 1004 decodes the next encoded MSP from the encoded offset data 613 of the Huffman encoded offset file 614. In one embodiment, the length of the encoded MSP is not stored in the Huffman encoded offset file 614. Rather, each of the possible codes is stored in the packed Huffman offset dictionary 615 with its associated length. The decoding operation 1004 iteratively reads in and temporarily stores bits from the encoded offset data 613. Each time the decoding operation 1004 reads another bit, the decoding operation 1004 searches the codes of the Huffman offset dictionary 615 having an associated length equal to the number of bits read. If one of the codes of the Huffman offset dictionary 615 matches the bits read from the encoded offset data 613, the value replaced by the copy item (such as in column 2 of Table 1) associated with the code is read from the Huffman encoded offset dictionary 615. The replaced value represents the MSP of the offset value of the copy item. A prepending operation 1006 then prepends the MSP to the LSP obtained in the read operation 910. Thus, the prepending operation 1006 reconstructs the entire offset value of the copy item.

Following the prepending operation 1006, a length decoding operation 1008 decodes an encoded length value associated with a copy item. The associated encoded length value is read from the encoded length data 617 of the Huffman encoded length file 618. In the length decoding operation 1008, a decoded length value is obtained by decoding the encoded length value. In such an operation, encoded length value may be decoded using a technique similar to the technique described in the offset decoding operation 1004. The length decoding operation 1008 iteratively reads one bit at a time from the encoded length data 617 and counts the number of bits read. It is determined if lengths associated with the codes stored in the Huffman length dictionary 619 are equal to the number of bits read. For any codes with associated lengths equal to the number of bits read, the codes are compared to the bits read from the encoded length data 617. If one of the codes matches, the length value of the copy item (such as in column 2 of Table 1) associated with the matching code is retrieved from the Huffman length dictionary 619. The copy item that is retrieved is the length value of the copy item and the operational flow 1000 is ended.

Importantly, by using the Huffman offset dictionary 615 and the Huffman length dictionary 619, the Huffman decoding process requires substantially less stack space than other conventional methods. The Huffman dictionaries may be viewed as flattened Huffman trees. Since the Huffman tree is flattened in embodiments described herein, the computer process of decoding is not required to "traverse" a Huffman tree. As a result, many stack pops and stack pushes typical of tree traversing schemes are unnecessary in embodiments of the present invention. Further, since more likely symbols are stored at the beginning of the Huffman dictionaries 615 and 619, the time to search the dictionaries for matching codes is minimized.

Figure 11:
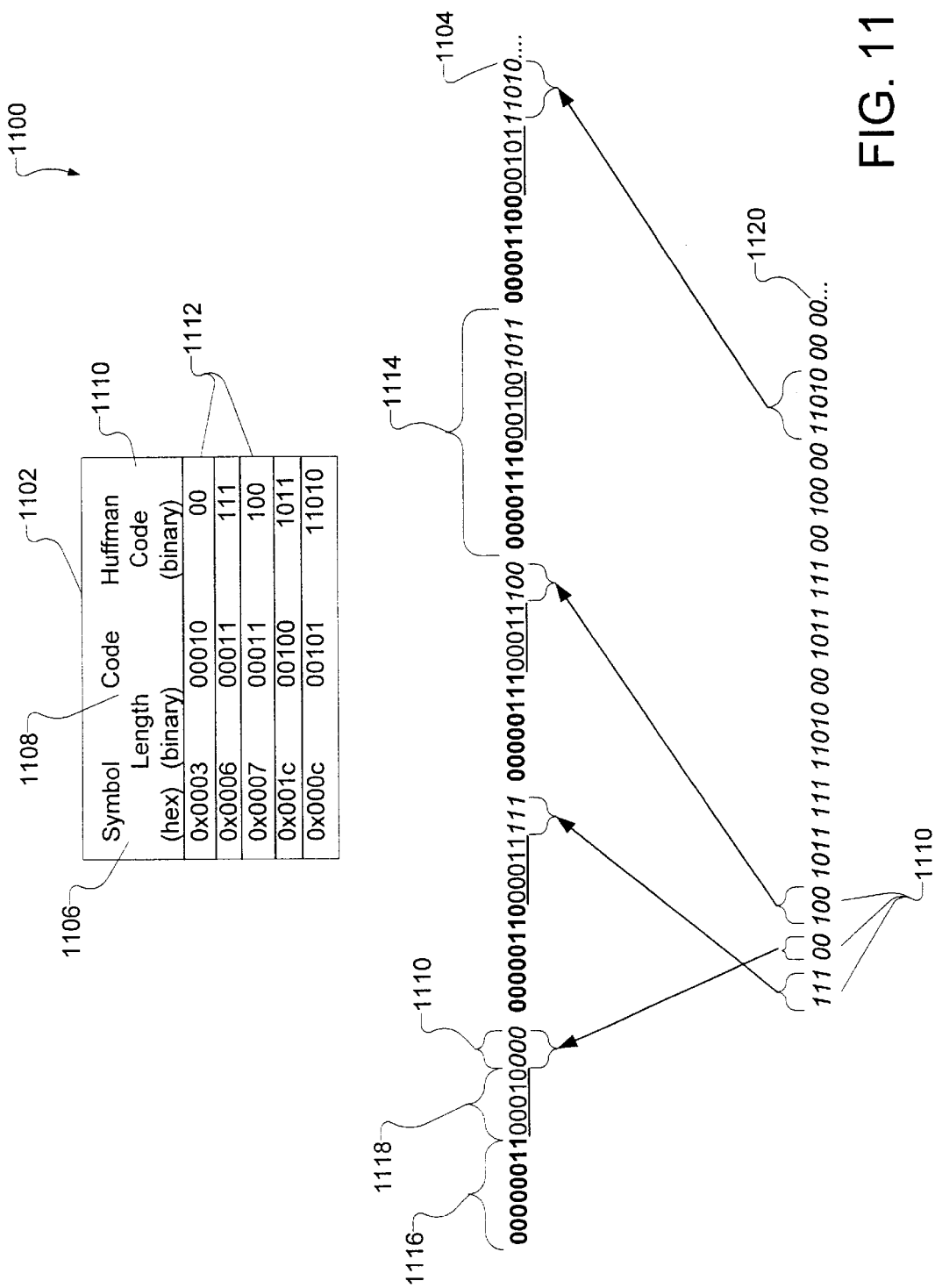
FIG. 11 illustrates a packed output of a Huffman encoding operation such as the one shown in FIG. 7 and how the packed output may be decoded by the decompressor module of FIG. 2.

By way of example, and not limitation, FIG. 11 illustrates one example of a packed output 1100 of an encoding operation such as the Huffman length encoding operation 850 and its use by the decompressor module 200. The output of an encoding operation, as discussed above, consists of a Huffman dictionary and a set of Huffman encoded data such as, for example, the Huffman length dictionary 619 and the encoded length data 617 shown in FIG. 6. FIG. 11 illustrates an embodiment that achieves further compression by packing the output of the encoding operations.

An exemplary Huffman dictionary 1102 of length values, similar to that shown in Table 1, is included as a table in FIG. 11 to assist the reader in understanding the packed dictionary 1104. The Huffman dictionary 1102 includes a series of length or MSP values (presented in hexadecimal notation) 1106, code lengths (in binary notation) 1108, and corresponding unique Huffman codes (in binary notation) 1110. Each set of length or MSP values 1106, code lengths 1108, and Huffman codes 1110 can be thought of as an entry 1112 in the Huffman dictionary 1102.

The packed Huffman dictionary 1104 form of the Huffman tree 1102 is shown below the table in FIG. 11. The packed dictionary 1104 includes packed entries 1114 that correspond to each of the separate dictionary entries 1112. As shown in FIG. 11, the packed Huffman dictionary 1104 is a continuous stream of binary data, however, to assist the reader the packed dictionary 1104 is shown with a space between each packed entry 1114. In the example, the first eight bits of each packed entry 1114 comprise the packed value 1116 (shown in bold face in FIG. 11 to assist in identification by the reader) and correspond to the binary form of the length or MSP value 1106. It will be undestood to one skilled in the art that while eight bits are used in this example to represent the packed value 1116, less or more bits may be used as long as the number of bits is enough to represent all values 1106 that have Huffman codes 1110.

The next five bits (shown underlined in FIG. 11 to assist in identification by the reader) of each packed entry 1114 are the packed code length 1118 and correspond to the code length 1108 of that entry 1112. Again, while this example uses five bits any number of bits may be used as long as they are sufficient to represent the largest length found in the Huffman dictionary 1102.

The remaining bits (shown italicized in FIG. 11 to assist in identification by the reader) of each packed entry 1114 are the associated Huffman code 1110 of each entry 1112. As discussed above, the length in bits of each Huffman code 1110 varies between packed entries 1114 and is equal to the value indicated by each preceding code length 1116. Therefore, the size of each packed entry 1114 will also vary depending on the size of the Huffman code 1110 in each entry 1114.

In the example illustrated in FIG. 11, after the packed dictionary 1104, the Huffman encoding operations then output packed Huffman encoded data 1120 that is the packed form of the encoded data such as, for example, the Huffman encoded length data 617 of FIG. 6. The packed Huffman encoded data 1120 consists solely of a stream of unique Huffman codes 1110. To assist the reader in identifying each individual Huffman code 1110 in the packed Huffman encoded data 1120, a space has been inserted between each Huffman code 1110.

FIG. 11 also illustrates how the packed Huffman dictionary 1104 may be used to obtain the original length or MSP values 1106 from the packed Huffman encoded data 1120. As discussed above, it is a characteristic of the Huffman codes 1110 that each Huffman code 1110 is unique. For example, since '100' is a three bit long binary Huffman code 1110, no other Huffman code 1110 contains '100' as its first three bits. This characteristic allows the packed Huffman encoded data 1120 to be read into a search buffer bit by bit. After each bit is read in, the decompressor module 200 sequentially searches the Huffman dictionary entries 1114 that have the same code length 1118 as the number of bits currently contained in the search buffer. If a matching Huffman code 1110 is not found, then the next bit is read into the search buffer from the Huffman encoded data 1120. The decompressor module 200 then searches the packed entries 1114 with the current number of bits in the search buffer for a matching Huffman code 1110. The process is repeated until the contents of the search buffer match a Huffman code 1110. When the contents of the search buffer match a Huffman code 1110, the decompressor module 200 obtains the corresponding length or MSP value 1116 for that Huffman code 1110 in the packed entry 1114, thus decoding that Huffman code 1110 into its corresponding value 1116. After obtaining the value 1116, the search buffer is cleared and the next bit of the packed Huffman encoded data 1120 is read into the search buffer and the search is repeated.

For example, looking now at the packed Huffman encoded data 1120 in FIG. 11, the decompressor module 200 would read the first bit of the packed encoded data 1120 into the search buffer. The decompressor module 200 would next search the packed dictionary 1104 looking first for length codes of length '1'. Since there are no single bit Huffman codes 1110, the search would be stopped and the decompressor module 200 would then read in the next bit of the packed Huffman encoded data 1120 into the search buffer. The search buffer now contains a two bit code '11'. The search would next look at the packed dictionary 1104 starting where it left off in the packed dictionary 1104. The first two bit length Huffman code 1110 in the packed dictionary 1104 is '00' which does not match the search buffer contents. The next packed entry 1114 has a three bit code length 1118 so the decompressor module 200 would stop the dictionary search and read in the next bit of the packed encoded data 1120 into the search buffer. The search buffer now contains the three bit code '111'. The decompressor module 200 would resume the search of the packed dictionary 1104 where it left off. The next packed entry 1114 in the packed dictionary 1104 has a code length 1118 of three and the contents of the search buffer match the Huffman code 1110. At this point, the decompressor module 200 has matched the Huffman code 1110 in the Huffman encoded data 1120 to a Huffman code 1110 in the packed dictionary 1104. The decompressor module 200 then reads the corresponding value 1116 from the matched packed entry 1114 and either outputs it or stores for use later. The search buffer is then cleared and the process is repeated to find the next Huffman code 1110 in the packed Huffman encoded data 1120 until the entire packed Huffman encoded data 1120 has been decoded.

Figure 12:
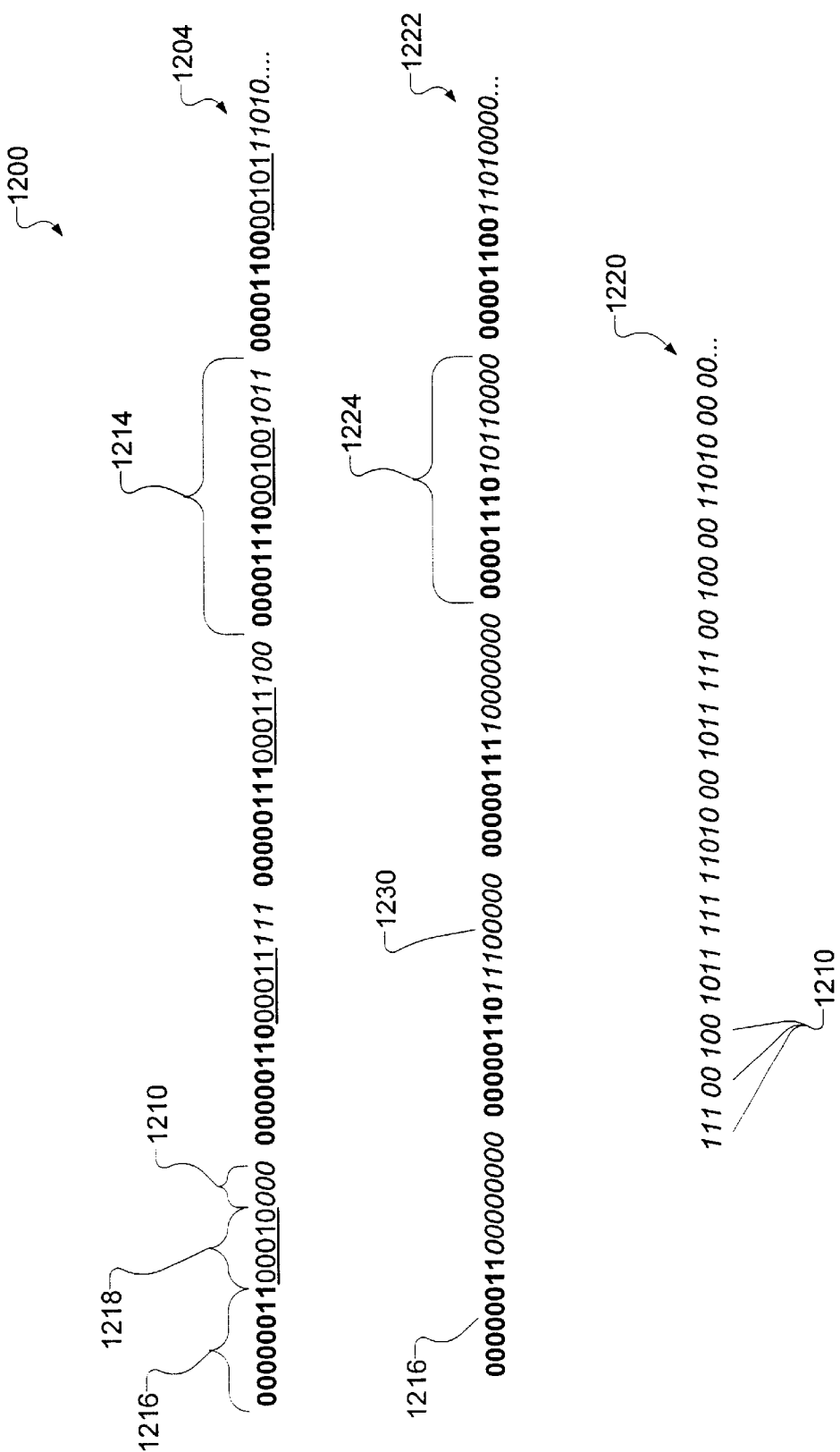
FIG. 12 illustrates an unpacked dictionary which may be created by a decompressor module as shown in FIG. 2 from the packed output shown in FIG. 11 and how an unpacked dictionary may be used by the decompressor module of FIG. 2.

Turning now to FIG. 12, an alternate embodiment of using a packed Huffman dictionary 1204 to obtain length or MSP values 1216 from packed Huffman encoded data 1220 is illustrated 1200. FIG. 12 shows a packed Huffman dictionary 1204 and packed Huffman encoded data 1220, which, for the sake of example, are identical to those illustrated in FIG. 11. The packed dictionary 1204 again can be thought of as containing packed entries 1214 that correspond to each of the separate dictionary entries 1112 shown in FIG. 11. The packed Huffman dictionary 1204 is a continuous stream of binary data, however, to assist the reader, the packed dictionary 1204 is shown with a space between each packed entry 1214. Consistent with the example shown in FIG. 11, the first eight bits of each packed entry 1214 are a packed length or MSP value 1216 (shown in bold face to assist in identification by the reader), the next five bits are a packed code length 1218 (shown underlined) and the remaining bits of each packed entry 1214 are the associated Huffman code 1210 (shown italicized).

In the embodiment illustrated in FIG. 12, the decompressor module 200 first unpacks the packed Huffman dictionary 1204 to create an unpacked dictionary 1222. The unpacked dictionary 1222 is created on the fly as the packed Huffman dictionary 1204 is read. The unpacked dictionary 1222 is created by unpacking each packed entry 1214 of the packed Huffman dictionary 1204 into an unpacked entry 1224. A packed entry 1214 is unpacked by storing the packed value 1216 of the packed entry 1214 into memory, determining the length of the Huffman code 1210 for that packed entry 1214 from the code length 1218 and then storing into memory an unpacked Huffman code 1230, which is an eight-bit version of the Huffman code 1210 where the Huffman code 1210 is the most significant bits of the eight-bit unpacked Huffman code 1230. For example, a Huffman code 1210 '1010' would become the eight-bit unpacked Huffman code 1230 '11010000'. This process of unpacking packed entries 1214 into unpacked entries 1224 is repeated until the entire packed dictionary 1204 has been unpacked and stored in memory. Thus, the unpacked dictionary 1222 contains two items: the packed value 1216, and an unpacked Huffman code 1230. The unpacked dictionary 1222 differs from the packed Huffman dictionary 1204 in that each item in the unpacked dictionary 1222 is stored as a fixed length word. The example shows each item in the unpacked dictionary 1222 as being eight bits in length, however, it should be noted that any fixed length can be used as long as the length is equal to or longer than the longest item in the packed dictionary 1204. Because the unpacked dictionary 1222 uses fixed lengths, the code length 1218 is no longer required to identify the Huffman codes of each unpacked entry 1224. The unpacked dictionary 1222 can be used to obtain the length or MSP values 1216 from the packed Huffman encoded data 1220 as follows. As discussed above, it is a characteristic of the Huffman codes 1210 that each code is unique. Therefore, each unpacked Huffman code 1230 will also be unique. A decompressor module 200 that uses an unpacked dictionary 1222, then, need only to search the unpacked Huffman codes until a match is found. An eight-bit search buffer is first loaded with six bits of '0' and then two bits of the Huffman encoded data 1220 are read in as the most significant bits of the buffer. For example, '11' is read into the eight-bit buffer to obtain '11000000'. Two bits are read in because, in this example, the smallest Huffman code 1210 is two bits long. Next, the decompressor module 200 sequentially searches the unpacked dictionary entries 1224 for a matching eight-bit unpacked Huffman code 1230. If a matching unpacked Huffman code 1230 is not found, then the next bit is read into the eight bit search buffer from the Huffman encoded data 1220. The decompressor module 200 then searches the unpacked entries 1224 for a matching unpacked Huffman code 1230. If no match is found, then another bit is read into the search buffer and the process is repeated until the contents of the search buffer match an unpacked Huffman code 1230. When the contents of the search buffer match an unpacked Huffman code 1230, the decompressor module 200 obtains the corresponding length or MSP value 1216 for the matching unpacked Huffman code 1230 in the unpacked entry 1224, thus decoding the Huffman code 1210 of the packed Huffman encoded data 1220 into its corresponding value 1216. After obtaining the value 1216, the search buffer is cleared and the next two bits of the packed Huffman encoded data 1220 is read into the search buffer and the search process is repeated. It should be understood that the discussion above of an eight-bit search buffer is exemplary only. Search buffers of any size may be used as well as using multiple search buffers.

In summary, one embodiments of the present invention may be viewed as a method of compressing a data input file (such as 612) to create a compressed data output file (such as 620). The method includes sequentially examining the data input file (such as 612) using a sliding window compression scheme (such as 700) to create root items (such as 708) and copy items (such as 710). The copy items (such as 710) created each having a length value (such as 732) and an offset value (such as 730). The offset values (such as 730) can be further subdivided into a most significant portion and a least significant portion that are dealt with differently by the method. The method creates an abridged root/copy file (such as 616) that includes the root items (such as 708) and the least significant portions of the offset values (such as 730) of the copy items (such as 710). The method compresses the most significant portions of the offset values (such as 730) of the copy items (such as 710) to create a compressed offset file (such as 614). The method also compresses the length values (such as 732) of the copy items (such as 710) to create a compressed length file (such as 618). As part of the method, the abridged root/copy file (such as 616), the compressed offset file (such as 614), and the compressed length file (such as 618) are combined to create the compressed data output file (such as 620).

Another embodiment may be viewed as a data decompression method for decompressing a compressed data input file (such as 620) that comprises a compressed length file (such as 618), a compressed offset file (such as 614), and an abridged root/copy file (such as 616). The abridged root/ copy file (such as 616) has root items (such as 708) and compressed copy items. Each of the compressed copy items are a least significant portion of an offset value (such as 730) of an uncompressed copy item (such as 710). Each uncompressed copy item (such as 710) comprises a length value (such as 732) and an offset value (such as 730).

One step of the data decompression method is receiving the compressed data input file (such as 620). The method decompresses the compressed length file (such as 618) to obtain length values (such as 732). Similarly, the method decompresses the compressed offset file (such as 614) to obtain most significant portions of the offset values (such as 730). The method forms uncompressed copy items (such as 710) from the least significant portions of the offset values (such as 730), the most significant portions of the offset values (such as 730), and the length values (such as 732). The method determines matching data strings identified by the uncompressed copy items (such as 710) and outputs a decompressed data output file (such as 204) comprising the root items (such as 708) and matching data strings.

Another embodiment may be viewed as a data storage device (such as 320) comprising a microprocessor (such as 516), a non-volatile memory (such as 524), a volatile memory (such as 530), a compressed operating code file (such as 620) stored in non-volatile memory (such as 524), and a decompressor module (such as 200) for decompressing the compressed operating code file (such as 620) wherein the compressed operating code file (such as 620) comprises a first compressed file (such as 618), a second compressed file (such as 614), and an abridged root/copy file (such as 616).

When viewed that way, the first compressed file (such as 618) can include a first Huffman dictionary (such as 619) and Huffman encoded length data (such as 617) encoded by the first Huffman dictionary (such as 619). Similarly, the second compressed file (such as 614) can include a second Huffman dictionary (such as 615) and Huffman encoded offset data (such as 613) encoded by the second Huffman dictionary (such as 615).

Yet another embodiment be viewed as a system for decompressing a compressed operating code file (such as 620) in a data storage device (such as 320) into an executable operating code file (such as 612). The data storage device (such as 320) stores the compressed operating code file (such as 620) in non-volatile memory (such as 524) on the data storage device (such as 320). The compressed operating code file (such as 620) includes an abridged root/copy file (such as 616), a first Huffman dictionary (such as 619), first Huffman encoded data (such as 617) encoded by the first Huffman dictionary (such as 619), a second Huffman dictionary (such as 615), and second Huffman encoded data (such as 613) encoded by the second Huffman dictionary (such as 615). The data storage device (such as 320) also includes a decompressor means (such as 200) for decompressing the compressed operating code file (such as 620) into an executable operating code (such as 612). Furthermore, the decompressor means may include an executable instruction file stored in non-volatile memory (such as 524) comprising instructions for decompressing the compressed operating code file (such as 620) into an executable operating code (such as 612) and a means for executing the instructions (such as 100).

It will be clear that the present invention is well adapted to attain the ends and advantages mentioned as well as those inherent therein. While a presently preferred embodiment has been described for purposes of this disclosure, various changes and modifications, variations in the exact location of specific data blocks (e.g. the first Huffman tree) within the emitted file for instance, may be made which are well within the scope of the present invention. For example, embodiments of the present invention cold be used for any small computer peripheral device that repeated startups and powers down during normal operation, such as compact disc drives, tape drives, diskette drives, printers, and scanners. Embodiments are also useful is smaller computing devices that have limited processing power such as personal data assistants, mobile telephones, and global positioning units. Numerous other changes may be made which will readily suggest themselves to those skilled in the art and which are encompassed in the spirit of the invention disclosed and as defined in the appended claims.

What is claimed is:

1. A method of compressing a data input file to create a compressed data output file, the method comprising steps of:
   a) sequentially examining the data input file using a sliding window compression scheme to create root items and copy items, the copy items each having a length value and an offset value, the offset values each having a most significant portion and a least significant portion;
   b) creating an abridged root/copy file, the abridged root/ copy file comprising the root items and the. least significant portions of the offset values of the copy items;

c) compressing the most significant portions of the offset values of the copy items to create a compressed offset file;

d) compressing the length values of the copy items to create a compressed length file; and e) combining the abridged root/copy file, the compressed offset file, and the compressed length file to create the compressed data output file.

2. The method of claim 1 wherein the compressing step c) is performed using a Huffman encoding algorithm and the compressed offset file comprises a first Huffman dictionary and a Huffman encoded offset file encoded by the first Huffman dictionary.

3. The method of claim 2 wherein the first Huffman dictionary includes unique Huffman codes for each unique most significant portion.

4. The method of claim 1 wherein the compressing step d) is performed using a Huffman encoding algorithm and the compressed length file comprises a second Huffman dictionary and a Huffman encoded length file encoded by the second Huffman dictionary.

5. The method of claim 4 wherein the second Huffman dictionary includes unique Huffman codes for each unique length value.

6. The method of claim 1 further comprising steps of:

f) storing in a first buffer the abridged root/copy file;

g) storing in a second buffer the most significant portions of the offset values of the copy items; and h) storing in a third buffer the length values of the copy items.

7. The method of claim 1 wherein in the compressed data output file comprises in order the compressed length file followed by the compressed offset file followed by the abridged root/copy file.

8. A computer-readable medium having computer-executable. instructions for performing the operations recited in claim 1.

9. The method of claim 1 wherein the copy items are represented by nine-bit symbols and the root items are represented by nine-bit symbols.

10. The method of claim 1 wherein examining step a), compressing step c), and compressing step d) are performed sequentially as a multi-pass compression method.

11. The method of claim 1 wherein at least a portion of the compressed data output file is packed into sequential data arrays.

12. A data decompression method for decompressing a compressed data input file, the compressed data input file comprising a compressed length file, a compressed offset file, and an abridged root/copy file, the abridged root/copy file having root items and compressed copy items, each compressed copy item comprising a least significant portion of an offset value of an uncompressed copy item, wherein each uncompressed copy item comprises a length value and an offset value, the method comprising steps of:

a) receiving the compressed data input file;

b) decompressing the compressed length file to obtain length values;

c) decompressing the compressed offset file to obtain most significant portions of the offset values;

f) forming uncompressed copy items from the least significant portions of the offset values, the most significant portions of the offset values, and the length values;

g) determining matching data strings identified by the uncompressed copy items; and h) outputting a decompressed data output file comprising the root items and matching data strings.

13. The method of claim 12 wherein the compressed offset file comprises a first Huffman dictionary and a Huffman encoded offset buffer file encoded by the first Huffman dictionary and the compressed length file comprises a second Huffman dictionary and a Huffman encoded length buffer file encoded by the second Huffman dictionary.

14. The method of claim 13 wherein the decompressing step c) further comprising steps of:

c)(1) storing the first Huffman dictionary in a first buffer;

c)(2) storing the most significant portion of the offset values in an offset buffer;

c)(3) storing the second Huffman dictionary in a second buffer; and c)(4) storing the length values in a length buffer.

15. The method of claim 14 further comprising the step of:

c(5) unpacking the first Huffman dictionary; and c(6) unpacking the second Huffman dictionary.

16. The method of claim 12 further comprising steps of:

i) storing the length values in a length buffer; and j) storing the second portions of the offset values in an offset buffer.

17. The method of claim 12 wherein the determining step g) further comprises:

g)(1) writing the root items into a sliding window; and g)(2) writing the matching data strings into the sliding window.

18. The method of claim 12 wherein the decompressed output file is executable operating code.

19. The method of claim 12 wherein at least a portion of the compressed input file is packed, sequential data.

20. A computer-readable medium having computer-executable instructions for performing the operations recited in claim 12.

21. A data storage device that uses the method of claim 12 to decompress data.

22. A disc drive that uses the method of claim 12 to decompress data.

23. A data storage device comprising a microprocessor, a non-volatile memory, a volatile memory, a compressed operating code file stored in non-volatile memory, and a decompressor module for decompressing the compressed operating code file wherein the compressed operating code file comprises a first compressed file, a second compressed file, and an abridged root/copy file.

24. The data storage device of claim 23 wherein the first compressed file comprises a first Huffman dictionary and Huffman encoded length data encoded by the first Huffman dictionary.

25. The data storage device of claim 23 wherein the second compressed file comprises a second Huffman dictionary and Huffman encoded offset data encoded by the second Huffman dictionary.

26. The data storage device of claim 23 wherein the data storage device is a disc drive.

27. A system for decompressing a compressed operating code file into an executable operating code file in a data storage device comprising:

the compressed operating code file stored in non-volatile memory on the data storage device, the compressed operating code file comprising an abridged root/copy file, a first Huffman dictionary, first Huffman encoded data encoded by the first Huffman dictionary, a second Huffman dictionary, and second Huffman encoded data encoded by the second Huffman dictionary; and a decompressor means for decompressing the compressed operating code file. into the executable operating code file.

28. The data storage device of claim 27 wherein the data storage device is a disc drive.

29. The data storage device of claim 27 wherein the decompressor means further comprises:

an executable instruction file stored in non-volatile memory comprising instructions for decompressing the compressed operating code file into an executable operating code; and a means for executing the instructions.

* * * * *